US012354997B2

(12) United States Patent
Chiu et al.

(10) Patent No.: US 12,354,997 B2
(45) Date of Patent: Jul. 8, 2025

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Sheng-Hsiang Chiu, Tainan (TW); Chia-Min Lin, Hsinchu (TW); Tzu-Ting Chou, Hsinchu (TW); Sheng-Feng Weng, Taichung (TW); Chao-wei Li, Hsinchu (TW); Chih-Wei Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 367 days.

(21) Appl. No.: 17/462,005

(22) Filed: Aug. 31, 2021

(65) Prior Publication Data
US 2023/0062468 A1 Mar. 2, 2023

(51) Int. Cl.
| | |
|---|---|
| *H01L 25/065* | (2023.01) |
| *H01L 21/56* | (2006.01) |
| *H01L 23/31* | (2006.01) |
| *H01L 25/00* | (2006.01) |
| *H01L 25/18* | (2023.01) |

(52) U.S. Cl.
CPC .......... *H01L 25/0652* (2013.01); *H01L 21/56* (2013.01); *H01L 23/3135* (2013.01); *H01L 23/3185* (2013.01); *H01L 25/18* (2013.01); *H01L 25/50* (2013.01)

(58) Field of Classification Search
CPC . H01L 25/0652; H01L 21/56; H01L 23/3185; H01L 25/18; H01L 25/50
See application file for complete search history.

(56) References Cited

U.S. PATENT DOCUMENTS

2014/0091461 A1 4/2014 Shen
2018/0047653 A1\* 2/2018 Costa .................. H01L 23/4334
(Continued)

FOREIGN PATENT DOCUMENTS

TW 200828536 7/2008

OTHER PUBLICATIONS

"Office Action of Taiwan Counterpart Application", issued on Jun. 7, 2023, p. 1-p. 7.

*Primary Examiner* — Thanh Y. Tran
(74) *Attorney, Agent, or Firm* — JCIPRNET

(57) ABSTRACT

A package structure including a substrate, a first semiconductor element disposed on and electrically connected with the substrate, a second semiconductor element disposed on and electrically connected with the substrate and a molding layer disposed over the substrate and covering at least a top surface of the substrate. The second semiconductor element and the first semiconductor element perform different functions. The molding layer encapsulates the second semiconductor element and wraps around sidewalls of the first semiconductor element. A top surface of the molding layer is higher than a top surface of the first semiconductor element. The molding layer has an opening extending from the top surface of the molding layer to the top surface of the first semiconductor element, so that the top surface of the first semiconductor element is exposed.

20 Claims, 21 Drawing Sheets

(56) References Cited

U.S. PATENT DOCUMENTS

| | | | |
|---|---|---|---|
| 2018/0151501 A1* | 5/2018 | Yu | H01L 23/3114 |
| 2019/0221543 A1* | 7/2019 | Sung | H01L 23/49822 |
| 2020/0203309 A1* | 6/2020 | Beyne | H01L 24/81 |
| 2022/0093523 A1* | 3/2022 | Shanmugam | H01L 21/568 |

\* cited by examiner

PACKAGE STRUCTURE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
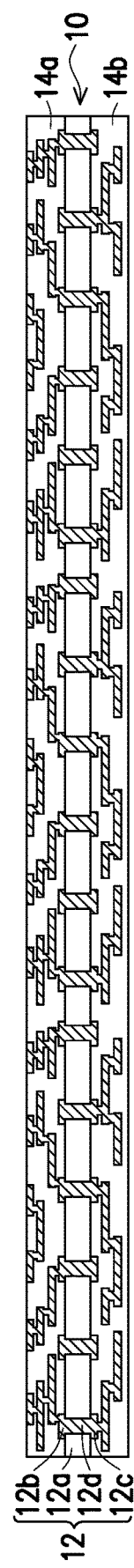
FIG. 1A through FIG. 1G are schematic cross-sectional views and top views schematically illustrating various stages of a process for fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A through FIG. 1G are cross-sectional views and top views schematically illustrating various stages of a process for fabricating a package structure in accordance with some embodiments of the present disclosure.

Referring to FIG. 1A, a substrate 10 is provided. In some embodiments, the substrate 10 includes a circuit substrate, a multilayered board substrate or an organic substrate. In some embodiments, the substrate 10 is a multilayered circuit board substrate or a system board circuit substrate. In some embodiments, the substrate 10 includes a core layer 12, a first build-up layer 14a disposed on a top surface of the core layer 12 and a second build-up layer 14b disposed on a bottom surface of the core layer 12. In some embodiments, the core layer 12 includes a core dielectric layer 12a, a first core conductive layer 12b disposed on an upper surface of the core dielectric layer 12a, a second core conductive layer 12c disposed on a lower surface of the core dielectric layer 12a and plated through holes 12d embedded in and penetrate through the core dielectric layer 12a.

In some embodiments, the core dielectric layer 12a includes prepreg, polyimide, photo image dielectric (PID), Ajinomoto buildup film (ABF), a combination thereof, or the like. However, the disclosure is not limited thereto, and other dielectric materials may also be used.

In some embodiments, the first core conductive layer 12b and the second core conductive layer 12c include copper, gold, tungsten, aluminum, silver, gold, a combination thereof, or the like. In some embodiments, the first core conductive layer 12b and the second core conductive layer 12c are copper foils coated or plated on the opposite sides of the core dielectric layer 12a. In some embodiments, the plated through holes 12d provide electrical paths between the electrical circuits located on the opposite sides of the core layer 12. In some embodiments, the plated through holes 12d are filled with one or more conductive materials. In some embodiments, the plated through holes 12d are lined with a conductive material and filled up with an insulating material. For example, the through holes are plated with copper with an electroplating or an electroless plating.

In some embodiments, the first build-up layer 14a and the second build-up layer 14b are disposed on the opposite sides of the core layer 12. Specifically, the first build-up layer 14a is formed over the first core conductive layer 12b of the core layer 12, and the second build-up layer 14b is formed over the second core conductive layer 12c of the core layer 12. In some embodiments, the formation of the first build-up layer 14a or the second build-up layer 14b includes sequentially forming a plurality of dielectric layers (not shown) and a plurality of conductive patterns (not shown) alternately stacked over the first surface of the core layer 12. In some embodiments, the formation of the first build-up layer 14a or the second build-up layer 14b involves photolithography and/or etching processes. In some embodiments, the formation of the first build-up layer 14a or the second build-up layer 14b involves film lamination followed by a laser drilling process. It is understood that the total number of layers of the first build-up layer 14a and the second build-up layer 14b may be modified based on the product requirements. In some embodiments, the materials of the dielectric layers include polyimide, polybenzoxazole (PBO), benzocyclobutene (BCB), prepreg, Ajinomoto buildup film (ABF), silicon nitride, silicon oxide, a combination thereof, or the like. In some embodiments, the materials of the conductive patterns include a metal material, such as aluminum, titanium, copper, nickel, tungsten, alloys thereof and/or combinations thereof. In some embodiments, the conductive patterns is formed by deposition, or plating.

In some embodiments, the number of layers in the first build-up layer 14a is equal to the number of layers in the second build-up layer 14b. In some embodiments, the first build-up layer 14a and the second build-up layer 14b are electrically connected through the plated through holes 12d.

In some other embodiments, the substrate 10 includes a semiconductor substrate made of an elemental semiconductor such as silicon, diamond or germanium, a compound semiconductor such as gallium arsenide, silicon carbide, indium arsenide, or indium phosphide or an alloy semiconductor, such as silicon germanium carbide, gallium arsenic phosphide, or gallium indium phosphide. In some embodiments, the substrate 10 includes a semiconductor-on-insulator (SOI) substrate such as silicon-on-insulator, germanium-on-insulator (GOI), silicon germanium on insulator (SGOI), or a combination thereof.

Figure 1B:
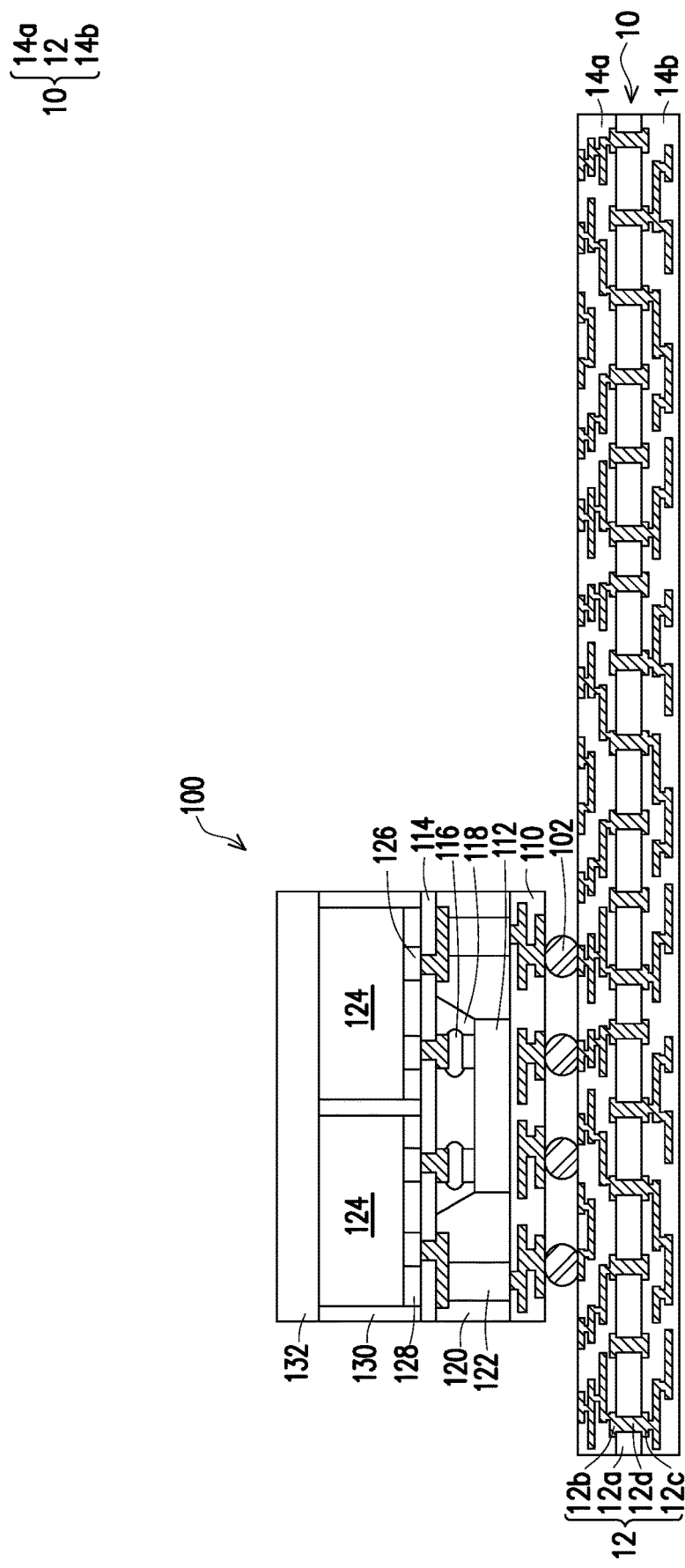

Referring to FIG. 1B, a first semiconductor element 100 is mounted on the substrate 10 and bonded to the substrate 10 through a plurality of first connectors 102. In some embodiments, the first semiconductor element 100 is mounted onto the substrate 10 and then a reflow process is performed so that the first semiconductor element 100 is bonded to the bond pad terminals of the substrate 10 through the first connectors 102. In some embodiments, the first connectors 102 include micro bumps, metal pillars, controlled collapse chip connection (C4) bumps, electroless nickel-electroless palladium-immersion gold technique (ENEPIG) formed bumps, a combination thereof (e.g., a metal pillar having a solder thereon), or the like. In some embodiments, the connectors 102 include C4 bumps or micro bumps. In some embodiments, the first connectors 102 include a metallic material such as solder, copper, aluminum, gold, nickel, silver, palladium, tin, a solder material, or combinations thereof. In some embodiments, the first connectors 102 include solder bumps or solder balls. In some embodiments, the solder material includes, for example, lead-based solders such as PbSn compositions, or lead-free solders including InSb compositions, SnCu compositions or SnAg compositions. In some embodiments, the first connectors 102 are formed by using electro or electroless plating techniques, screen-printing or jet printing techniques.

In some embodiments, the first semiconductor element 100 includes or is a package including a multi-chip stacked package, a chip on wafer (CoW) package, an integrated fan-out (InFO) package, a chip-on-wafer-on-substrate (CoWoS) package, a three-dimensional integrated circuit (3DIC) package, or a combination thereof. In some embodiments, the first semiconductor element 100 includes an InFO package. In some embodiments, the first semiconductor element 100 includes a semiconductor die having active elements or functional elements and passive elements. In some embodiments, the first semiconductor element 100 includes one or more semiconductor dies performing different functions, and the semiconductor dies may independently be or include a logic die, such as a central processing unit (CPU) die, a graphic processing unit (GPU) die, a micro control unit (MCU) die, an input-output (I/O) die, a baseband (BB) die, a system-on-chip (SoC) die, a large-scale integrated circuit (LSI) die or an application processor (AP) die, or may independently be or include a memory die such as a high bandwidth memory (HBM) die. In some embodiments, the first semiconductor element 100 includes at least one of AP dies, LSI dies or SoC dies.

In some embodiments, the first semiconductor element 100 includes an InFO package, and the first semiconductor element 100 includes a redistribution circuit structure 110, an integrated circuit (IC) 112 disposed on the redistribution circuit structure 110, a redistribution layer 114 disposed on the integrated circuit 112, bumps 116 disposed between the integrated circuit 112 and the redistribution layer 114, and an underfill 118 filled between the integrated circuit 112 and the redistribution layer 114. In some embodiments, the first semiconductor element 100 includes an insulating encapsulation 120 encapsulating the integrated circuit 112, conductive pillars 122 penetrating through the insulating encapsulation 120, integrated circuits 124 disposed on the redistribution layer 114, bumps 126 disposed between the integrated circuits 124 and the redistribution layer 114, an underfill 128 filled between each of the integrated circuits 124 and the redistribution layer 114, and an insulating encapsulation 130 encapsulating the integrated circuits 124. In some embodiments, the first semiconductor element 100 includes an optional protective cover 132 disposed on and covering the integrated circuits 124 and the insulating encapsulation 130.

In some embodiments, the redistribution circuit structure 110 includes alternately stacked dielectric layers and conductive patterns. In some embodiments, the materials of the dielectric layers include polyimide, PBO, BCB, a combination thereof, or the like. In some embodiments, the conductive patterns include metal, such as aluminum, titanium, copper, nickel, tungsten, and/or alloys thereof. In some embodiments, the redistribution layer 114 includes alternatively stacked dielectric layers and conductive patterns, and the materials and formation methods of the redistribution layer 114 may be similar to those of the redistribution circuit structure 110, so that the details are not repeated herein.

In some embodiments, the integrated circuit 112 includes or is an LSI die, and the integrated circuits 124 include or are SoC dies. The integrate circuit 112 is electrically connected with the integrated circuits 124 through the redistribution layer 114, the conductive pillars 122 and the redistribution circuit structure 110. In some embodiments, the bumps 116 include micro bumps, and the bumps 126 include micro bumps. In some embodiments, the insulating encapsulation 120 or 130 includes a molding compound formed by a molding process. In some embodiments, the material of the insulating encapsulation 120 or 130 includes epoxy resin, phenolic resins and/or fillers. The conductive pillars 122 electrically connect the redistribution circuit structure 110 and the redistribution layer 114. In some embodiments, the conductive pillars 122 include metal, such as aluminum, titanium, copper, nickel, tungsten, and/or alloys thereof.

In some embodiments, the protective cover 132 may be adhered onto the top surfaces of the integrated circuits 124 and the insulating encapsulation 130 to provide protection for the InFO package. In some embodiments, the protective cover 132 includes a glass cover. In some embodiments, the protective cover 132 includes a dielectric layer, a passivation layer or a polymeric material layer. Since the protective cover 132 is optionally formed, it is possible that the first semiconductor element 100 has no protective cover and the back surfaces of the integrated circuits 124 are exposed without covering and bare in some embodiments of this disclosure.

Figure 1C:
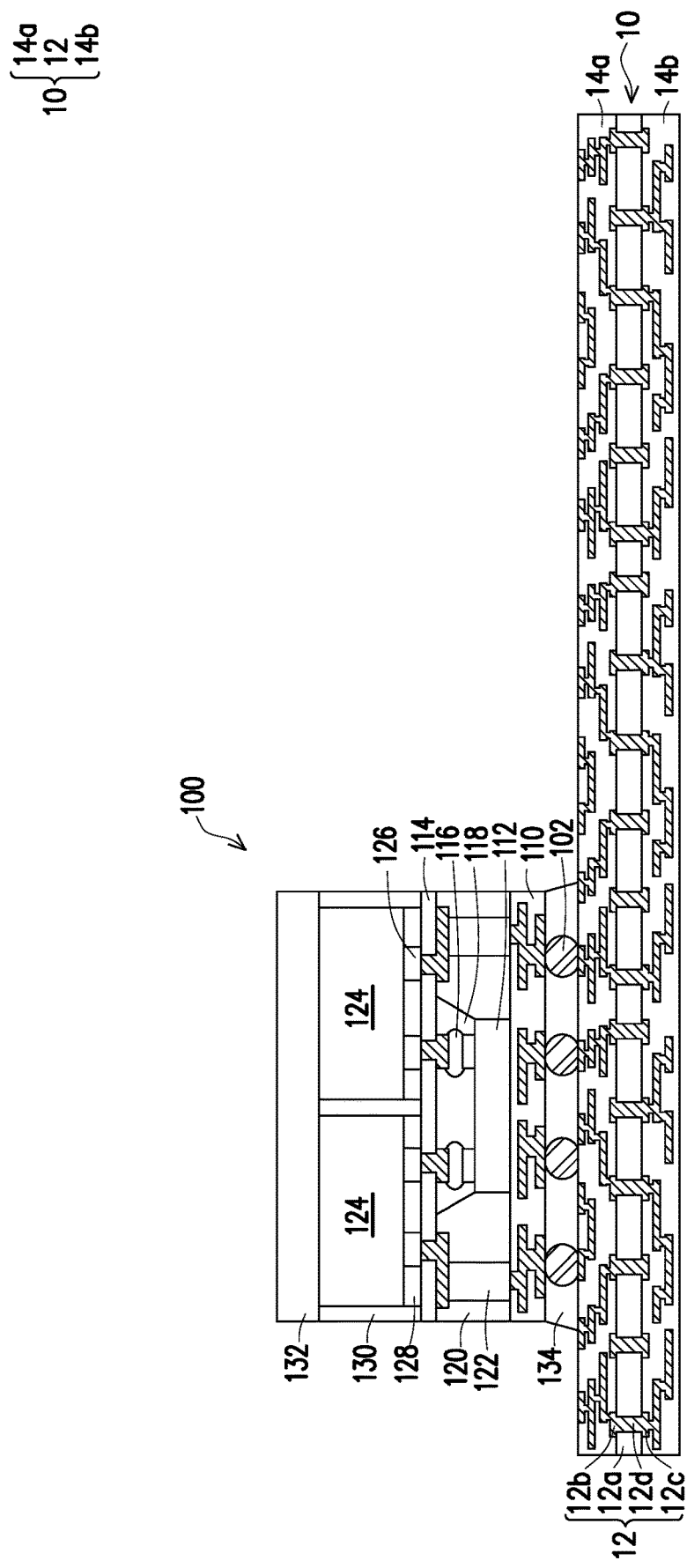

Referring to FIG. 1C, in some embodiments, an underfill 134 is formed between the first semiconductor element 100 and the substrate 10 and surrounds the first connectors 102. For example, the underfill 134 may be filled into the space between the first connectors and the substrate 10 by a capillary flow process and then cured. In some embodiments, the underfill 134 includes a resin material including an epoxy resin material without or with fillers such as silica fillers or ceramic fillers. In some embodiments, the underfill 134 fully fills between the first connectors 102 and the substrate 10 to strengthen the structural integrity, which helps to counterbalance the potential warpage of the whole structure.

Figure 1D:
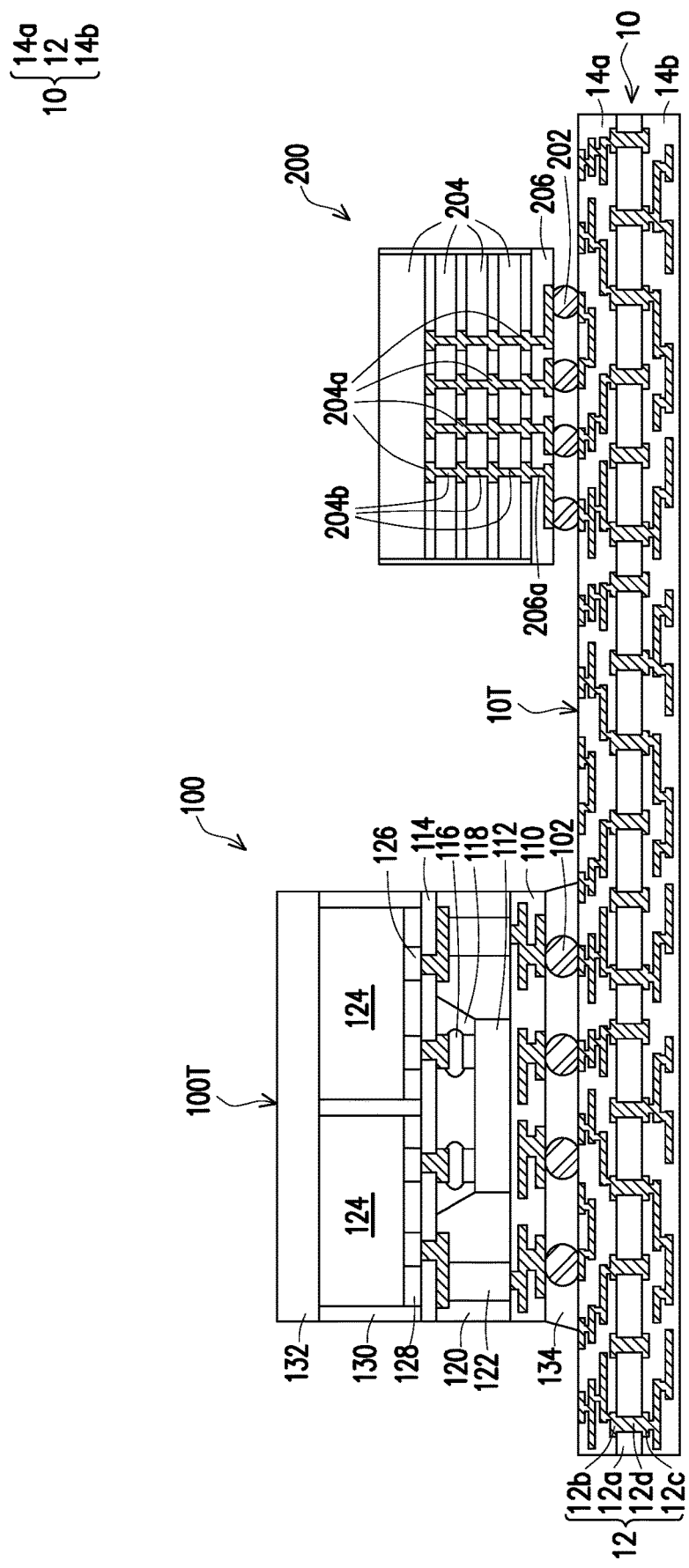
Figure 1E:
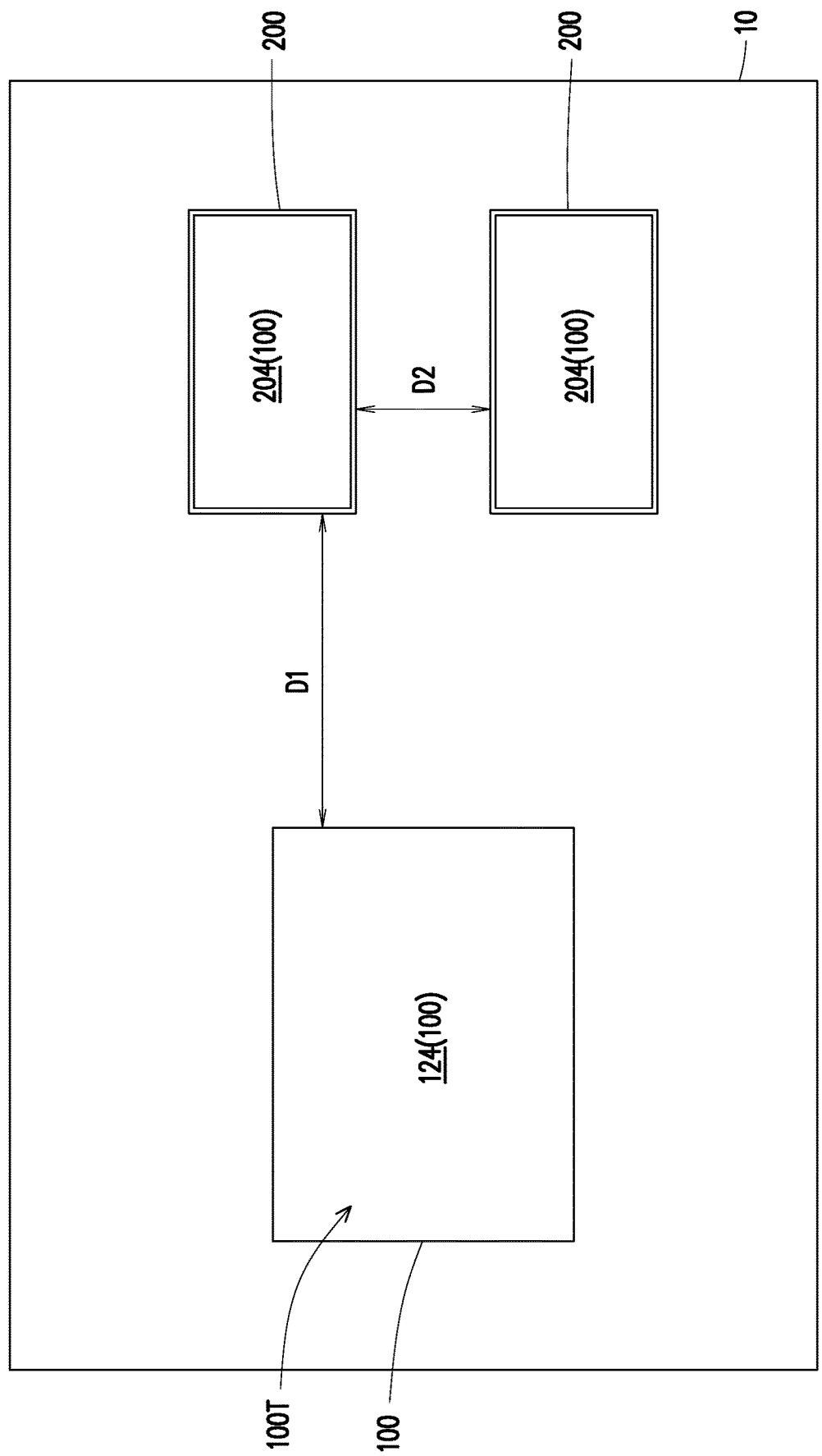

FIG. 1E is a schematic top view of the package structure illustrated in FIG. 1D. Referring to FIG. 1D and FIG. 1E, two second semiconductor elements 200 are mounted and bonded onto the substrate 10 through a plurality of second connectors 202. In some embodiments, the second semiconductor elements 200 are mounted and bonded to the substrate 10 through the flip chip bonding process. In some embodiments, the second connectors 202 includes C4 bumps or micro bumps. In some embodiments, the second semiconductor elements 200 perform different functions from the first semiconductor element 100 and the first and second semiconductor elements are different types of elements. In certain embodiments, the first semiconductor element 100 may include one or more logic dies, and the second semiconductor elements 200 include one or more memory dies.

In some embodiments, either of the second semiconductor elements 200 includes or is a package including a multi-chip stacked package, a chip on wafer (CoW) package, an integrated fan-out (InFO) package, a chip-on-wafer-on-substrate (CoWoS) package, a three-dimensional integrated circuit (3DIC) package, or a combination thereof. In some embodiments, either of the second semiconductor elements 200 includes or is a semiconductor die having active elements or functional elements and passive elements. In some embodiments, either of the second semiconductor elements 200 includes or is a memory die such as a high bandwidth memory (HBM) die, or may include or be a logic die, such as a central processing unit (CPU) die, a graphic processing unit (GPU) die, a micro control unit (MCU) die, an input-output (I/O) die, a baseband (BB) die, a system-on-chip (SoC) die, a large-scale integrated circuit (LSI) die or an application processor (AP) die. In some embodiments, the second semiconductor elements 200 includes memory dies, and the memory dies are HBM die including a plurality of stacked memory chips 204 and a controller 206. Each of the memory chips 204 includes a plurality of micro-bumps 204a, and parts of the memory chips 204 include a plurality of through vias 204b (e.g. through silicon vias). The controller 206 includes a plurality of through vias 206a (e.g. through silicon vias) electrically connected to the second connectors 202. Through the micro-bumps 204a, the through vias 204b and the through vias 206a, the stacked memory chips 204 and the controller 206 are electrically connected. Herein, the second semiconductor elements 200 are bonded to the substrate 10 without filling the underfill.

Although the first semiconductor element 100 is mounted on the substrate 10 before mounting the second semiconductor element 200 as described in some embodiments shown from FIG. 1B to FIG. 1E, it is understood that the mounting sequence of the first and second semiconductor elements is not limited by the embodiments provided herein but can be arbitrarily changed or adjusted.

Referring to FIG. 1E, the first semiconductor element 100 and the second semiconductor element 200 are arranged side by side and separate from one another with proper distances. It is understood that the arrangement of these elements is not limited by the drawings shown herein and may be modified based on the product design. In one embodiment, from a top view, one first semiconductor element 100 and two second semiconductor elements 200 are arranged aside one another, the first semiconductor element 100 located at the left side is spaced apart from the two second semiconductor elements 200 with a distance D1, while the second semiconductor elements 200 located at the right side of the substrate 10 are spaced apart from each other with a distance D2. In some embodiments, the first semiconductor element 100 and the second semiconductor elements 200 are arranged at locations in an unsymmetrical way.

Figure 1F:
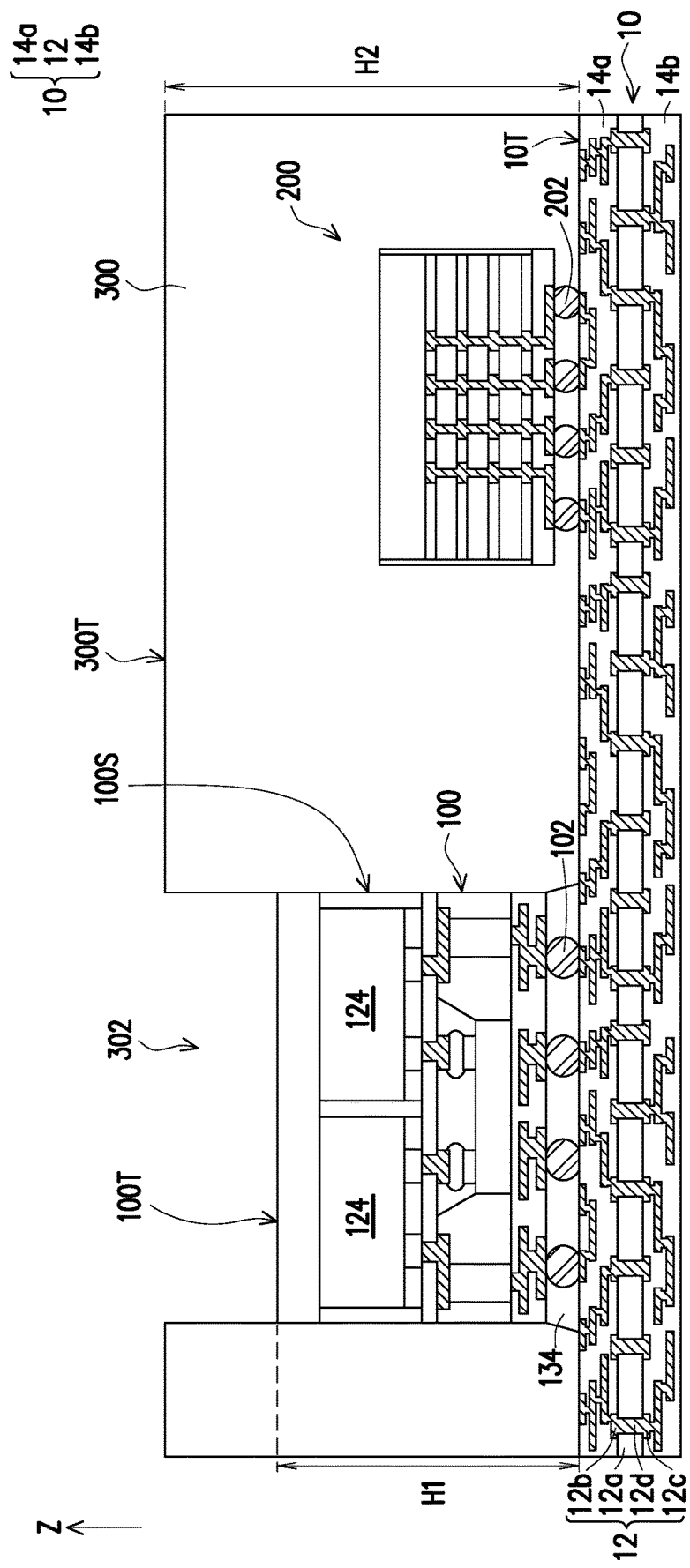
Figure 1G:
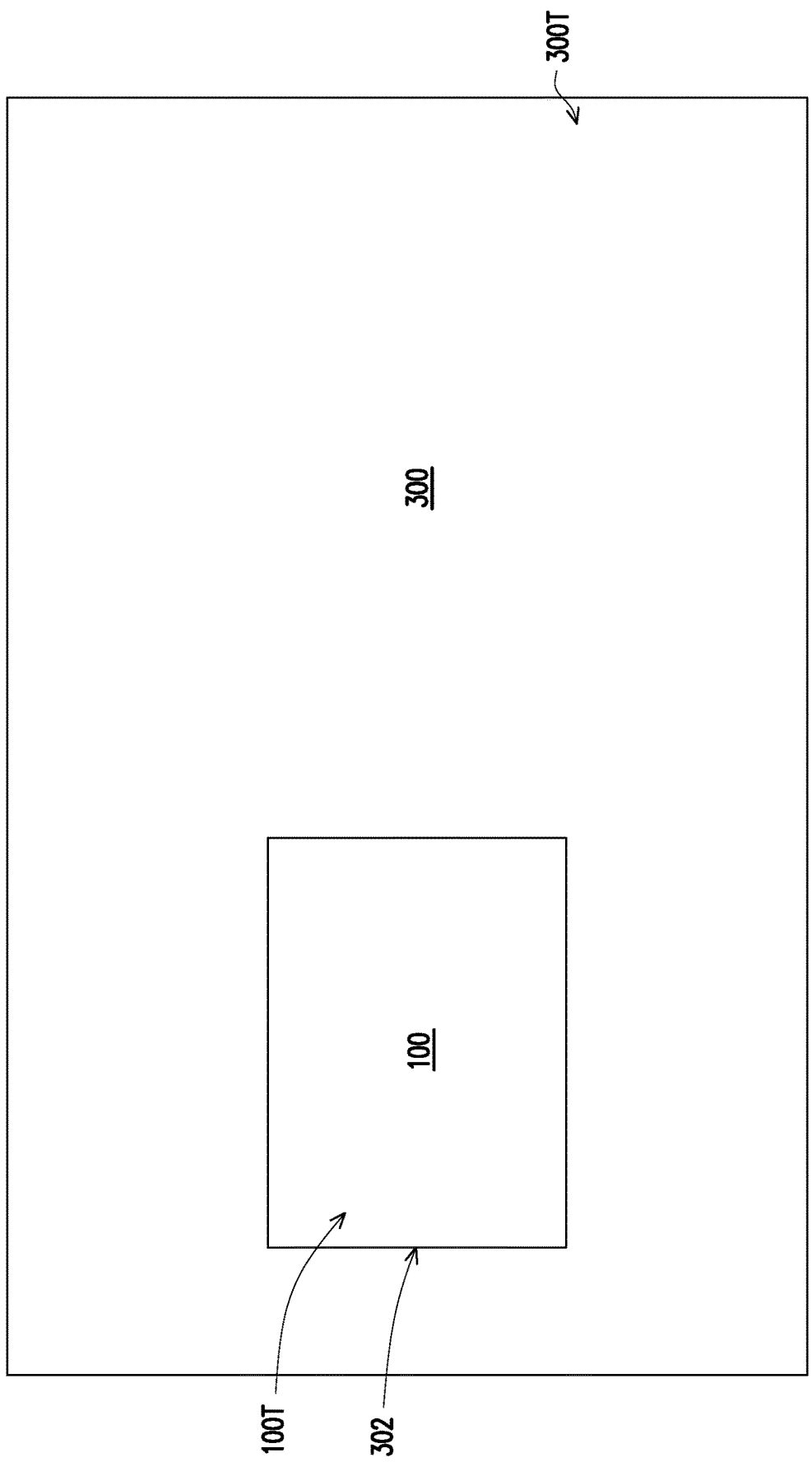

FIG. 1G is a schematic top view of the package structure illustrated in FIG. 1F. Referring to FIG. 1F and FIG. 1G, a molding layer 300 is formed over the substrate 10 with at least an opening 302, and the molding layer 300 covers the top surface 10T of the substrate 10 and the second semiconductor elements 200 but exposes the first semiconductor element 100. In some embodiments, the molding layer 300 encapsulates the second semiconductor elements 200 and at least covers the sidewalls 100S of the first semiconductor element 100. In some embodiments, the molding layer 300 encapsulates the second semiconductor elements 200 and the second connectors 202, so that the molding layer 300 is in direct contact with the second connectors 202. In some embodiments, the molding layer 300 wraps around the sidewalls 100S of the first semiconductor element 100 and the underfill 134.

In some embodiments, the molding layer 300 is formed by molding such as injection molding, transfer molding, compression molding or over-molding. In one embodiment, the formation of the molding layer 300 involves forming a molding material (not shown) over the substrate 10 entirely covering the first semiconductor element 100 and the second semiconductor element 200 by an injection molding process with the molding material in excess. That is, the molding material covers the top surfaces of the first semiconductor element 100 and the second semiconductor element 200 and is higher (in the thickness direction Z) than the first semiconductor element 100 and the second semiconductor element 200. Later, the opening 302 is formed by removing a portion of the molding material by photolithographic and etching processes. In one embodiment, the molding layer 300 is formed by a transfer molding process with a portion of the mold in direct contact with the backside (i.e. top surface) of the first semiconductor element 100 so that the molding layer 300 is formed with the opening 302 to reveal the top surface of the first semiconductor element 100 after demolding.

In some embodiments, the material of the molding layer 300 includes a resin such as an epoxy resin, a phenolic resin or a thermosetting resin material. In one embodiment, the molding layer 300 is made of a molding material having a suitable thermal expansion coefficient. For example, the molding material has a coefficient of thermal expansion CTE1 measured at a temperature lower than the glass transition temperature (Tg) is about 3 to 50 (ppm/° C.). In one embodiment, CTE1 of the molding material of the molding layer 300 ranges from 10 to 25 (ppm/° C.).

As seen in FIG. 1F, the top surface 100T (the backside) of the first semiconductor element 100 is exposed from the opening 302, and the top surface 300T of the molding layer 300 is higher (in the thickness direction Z) than the top surface 100T of the first semiconductor element 100. In one embodiment, the first semiconductor element 100 has a height H1 measuring from the top surface 10T of the substrate 10 to the top surface 100T of the first semiconductor element 100, while the molding layer 300 has a height H2 measuring from the top surface 10T of the substrate 10 to the top surface 300T. In some embodiments, the height H2 of the molding layer 300 is larger than the height H1 of the first semiconductor element 100. In some embodiments, the height H2 is about 30%-100% larger than the height H1. That is, H2 is about 1.3 times to about 2.0 times of the height H1. In some embodiments, the height H2 is about 40%-80% larger than the height H1. That is, H2 is about 1.4 times to about 1.8 times of the height H1. In some embodiments, the height H2 is about 50%-60% larger than the height H1. That is, H2 is about 1.5 times to about 1.6 times of the height H1. Through forming thicker or higher molding layer 300, the molding layer 300 higher than the first semiconductor element 100 helps to relieve and counterbalance the potential warpage of the whole structure.

As seen in FIG. 1G, in one embodiment, the size (or span) of the opening 302 is substantially the same size (or span) of the first semiconductor element 100, and the entire top surface 100T of the first semiconductor element 100 is fully revealed by the opening 302. In one embodiment, the vertical projection of the opening 302 (on to the top surface 100T along the Z axis) is fully overlapped with the top surface 100T of the first semiconductor element 100. In one embodiment, as the top surface 100T of the first semiconductor element 100 is exposed and bare, the opening 302 functions as an air gap existing between the molding layer 300 and the first semiconductor element 100, which promotes the heat dissipation of the first semiconductor element 100. Although in one embodiment, as seen from the top view of FIG. 1G, the sizes (area) of the opening 302 are substantially the same as the sizes (area) of the first semiconductor element 100, and the top surface 100T of the first semiconductor element 100 is fully exposed the opening 302, it is understood that the number of the opening(s), the dimensions, sizes or shapes of the opening(s) are not limited by the embodiments provided herein.

Figure 2A:
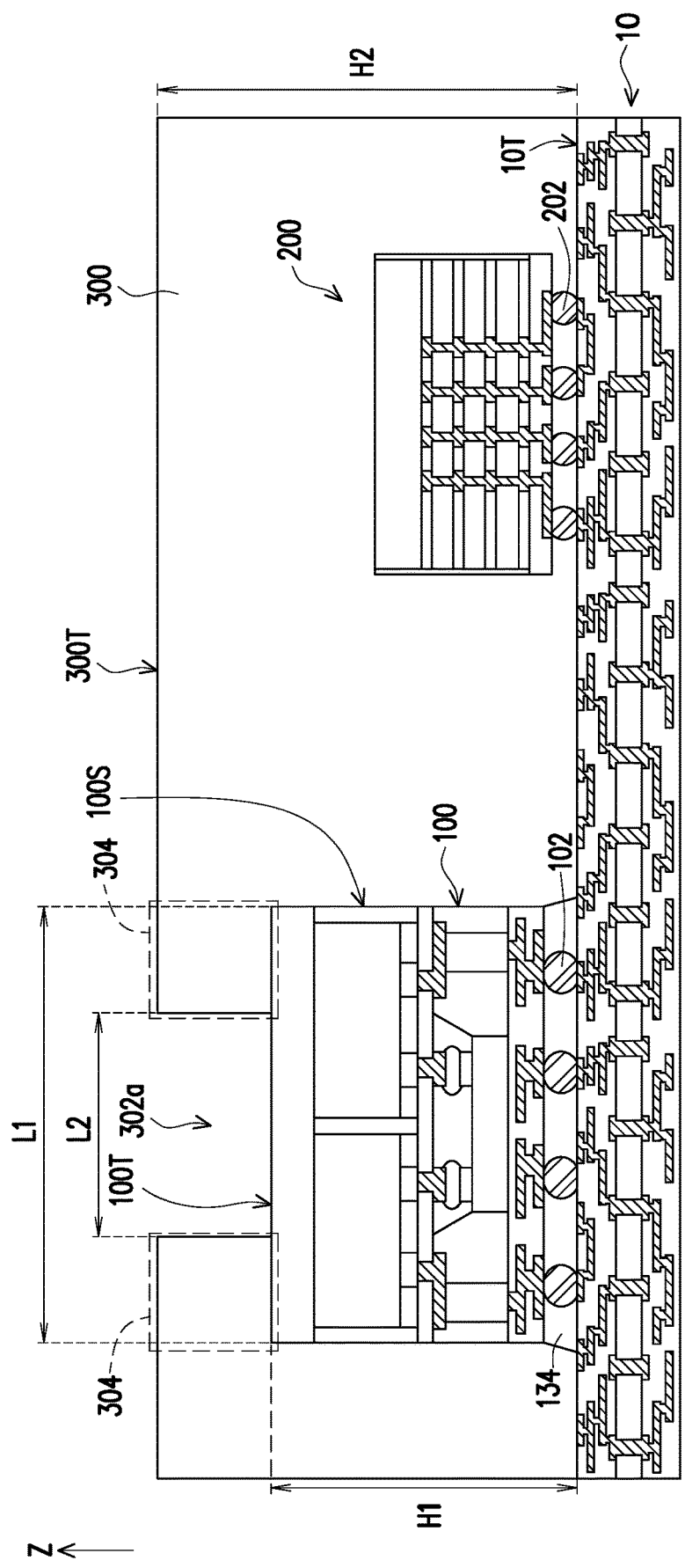
FIG. 2A illustrates a schematic cross-sectional view of a package structure in accordance with some embodiments of the present disclosure.
Figure 2B:
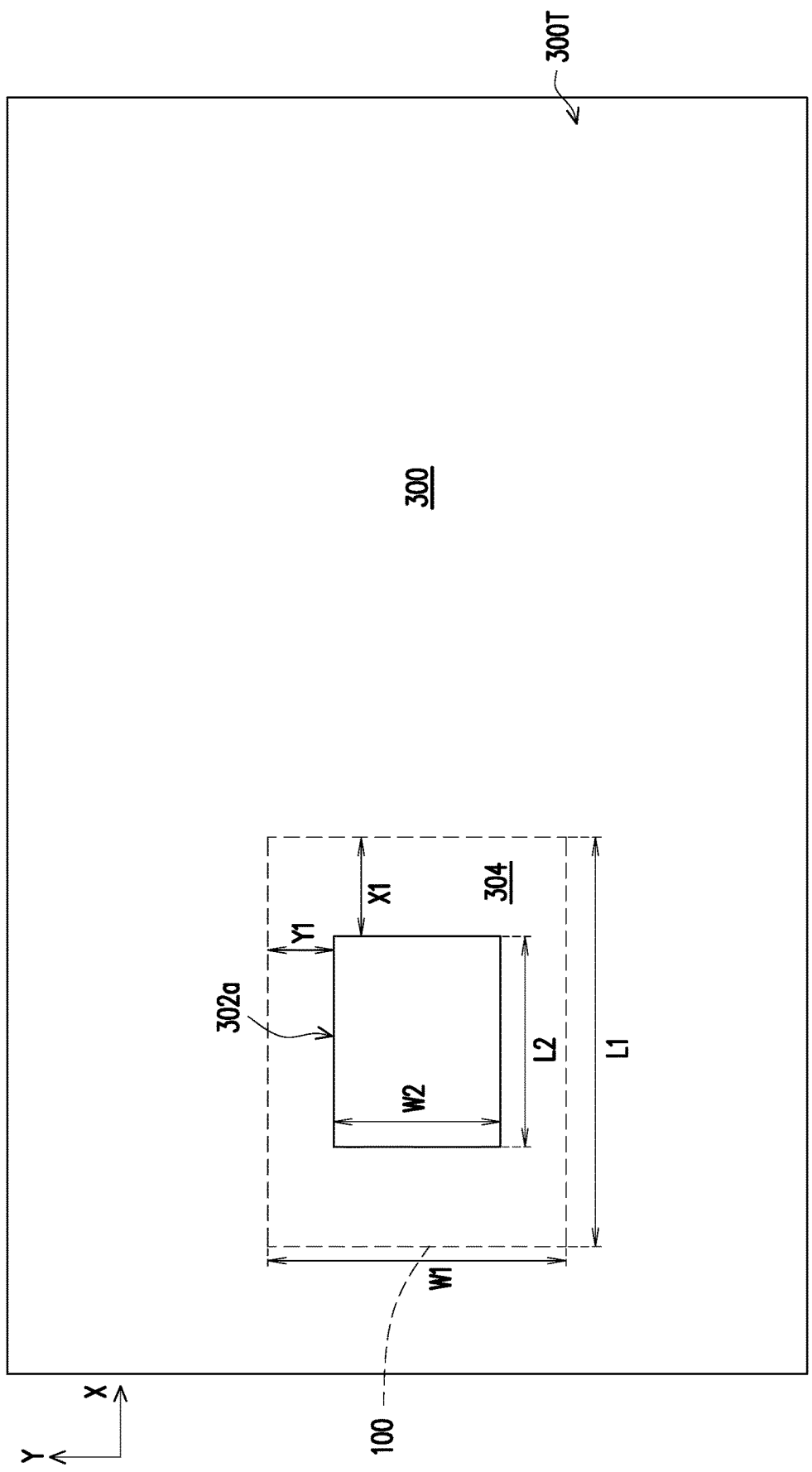
FIG. 2B is a schematic top view of the package structure illustrated in FIG. 2A.

FIG. 2A illustrates a schematic cross-sectional view of a package structure in accordance with some embodiments of the present disclosure. FIG. 2B is a schematic top view of the package structure illustrated in FIG. 2A.

In one embodiment, the package structure illustrated in FIG. 2A and FIG. 2B has a structure similar to the structure illustrated in FIG. 1F and FIG. 1G, except that the molding layer 300 has an opening 302a and the top surface 100T of the first semiconductor element 100 is partially revealed by the opening 302a. As seen in FIG. 2A, the top surface 100T (the backside) of the first semiconductor element 100 is exposed from the opening 302a, and the top surface 300T of the molding layer 300 is higher (in the thickness direction Z) than the top surface 100T of the first semiconductor element 100. Similarly, the height H2 of the molding layer 300 is larger than the height H1 of the first semiconductor element 100. In some embodiments, the height H2 is about 30%-100% larger than the height H1. In some embodiments, the height H2 is about 40%-80% larger than the height H1. In some embodiments, the height H2 is about 50%-60% larger than the height H1.

As seen in FIG. 2B, in one embodiment, the size (or span) of the opening 302a is smaller than the size (or span) of the first semiconductor element 100, and a central portion of top surface 100T of the first semiconductor element 100 is revealed by the opening 302a. In one embodiment, the first semiconductor element 100 (the span of the first semiconductor element 100 is shown as a dashed line rectangle) has a length L1 in the X-direction and a width W1 in the Y-direction, and the opening 302a has a length L2 in the X-direction and a width W2 in the Y-direction. In some embodiments, the length L2 is smaller than the length L1 and is about 5-50% of the length L1, while the width W2 is smaller than the width W1 and is about 5-50% of the width W1. In some embodiments, the length L2 is about 10-40% of the length L1, while the width W2 is about 10-40% of the width W1. In some embodiments, the length L2 is about 20-30% of the length L1, while the width W2 is about 20-30% of the width W1. In some embodiments, the vertical projection of the opening 302a is fully overlapped with the top surface 100T of the first semiconductor element 100, but the area of the vertical projection of the opening 302a is smaller than the whole area of the top surface 100T of the first semiconductor element 100. In some embodiments, the vertical projection of the opening 302a occupies about 25% to about 0.25% of the whole area of the top surface 100T of the first semiconductor element 100. That is, about 25% to about 0.25% (less than 25%) of the whole area of the top surface 100T of the first semiconductor element 100 is revealed by the opening 302a. In some embodiments, about 16% to about 1% of the whole area of the top surface 100T of the first semiconductor element 100 is revealed by the opening 302a. In some embodiments, about 9% to about 4% of the whole area of the top surface 100T of the first semiconductor element 100 is revealed by the opening 302a.

Referring to FIG. 2A and FIG. 2B, in one embodiment, the molding layer 300 has extended portions 304 located directly on the top surface of the first semiconductor element 100, and the extended portions 304 extend from the sidewalls 100S to the opening 302a. The smaller opening 302a is defined by the extended portions 304. From the top view of FIG. 2B, the extension length X1 in the X-direction is about 25-47.5% of the length L1, and the extension length Y1 in the Y-direction is about 25-47.5% of the width W1. In some embodiments, the extension length X1 in the X-direction is about 30-45% of the length L1, and the extension length Y1 in the Y-direction is about 30-45% of the width W1. In some embodiments, the extension length X1 in the X-direction is about 35-40% of the length L1, and the extension length Y1 in the Y-direction is about 35-40% of the width W1. Through forming the molding layer 300 with the extended portions 304, the extended portions 304 in direct contact with the top surface 100T of the first semiconductor element 100 further lessen and counterbalance the potential warpage of the whole structure.

Figure 3A:
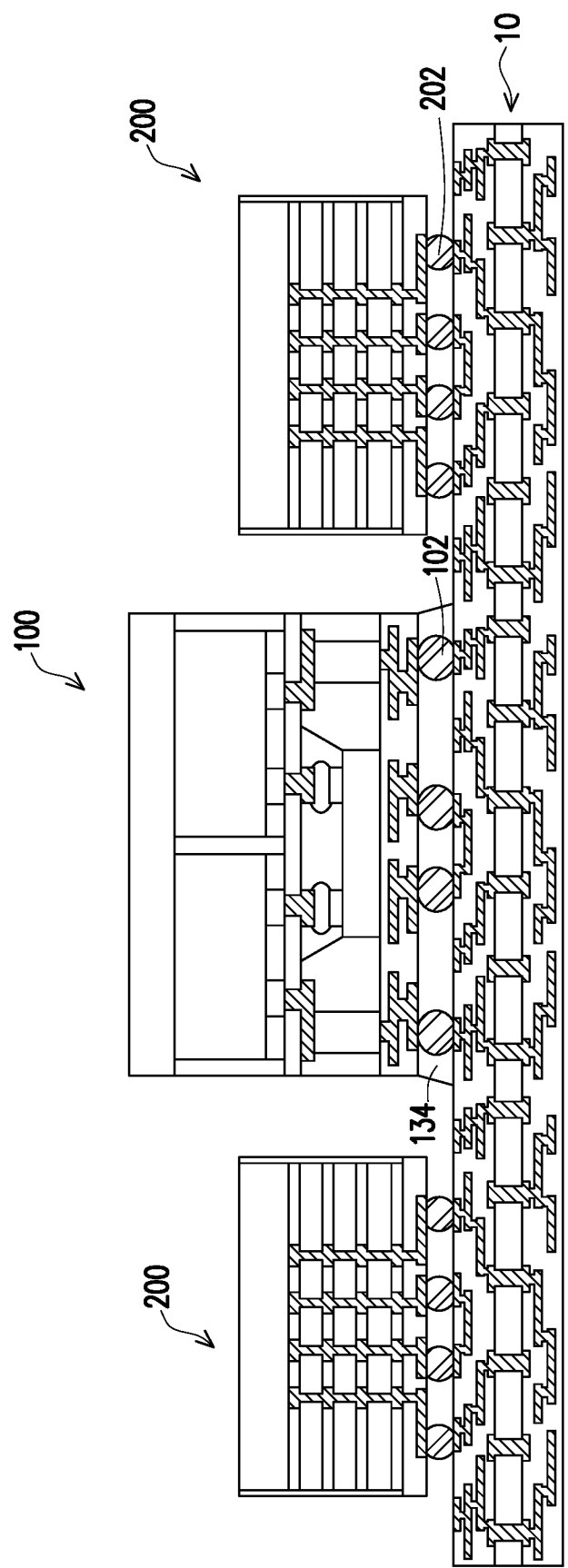
FIG. 3A through FIG. 3D are schematic cross-sectional views and top views schematically illustrate various stages of a process for fabricating a package structure in accordance with some embodiments of the present disclosure.
Figure 3B:
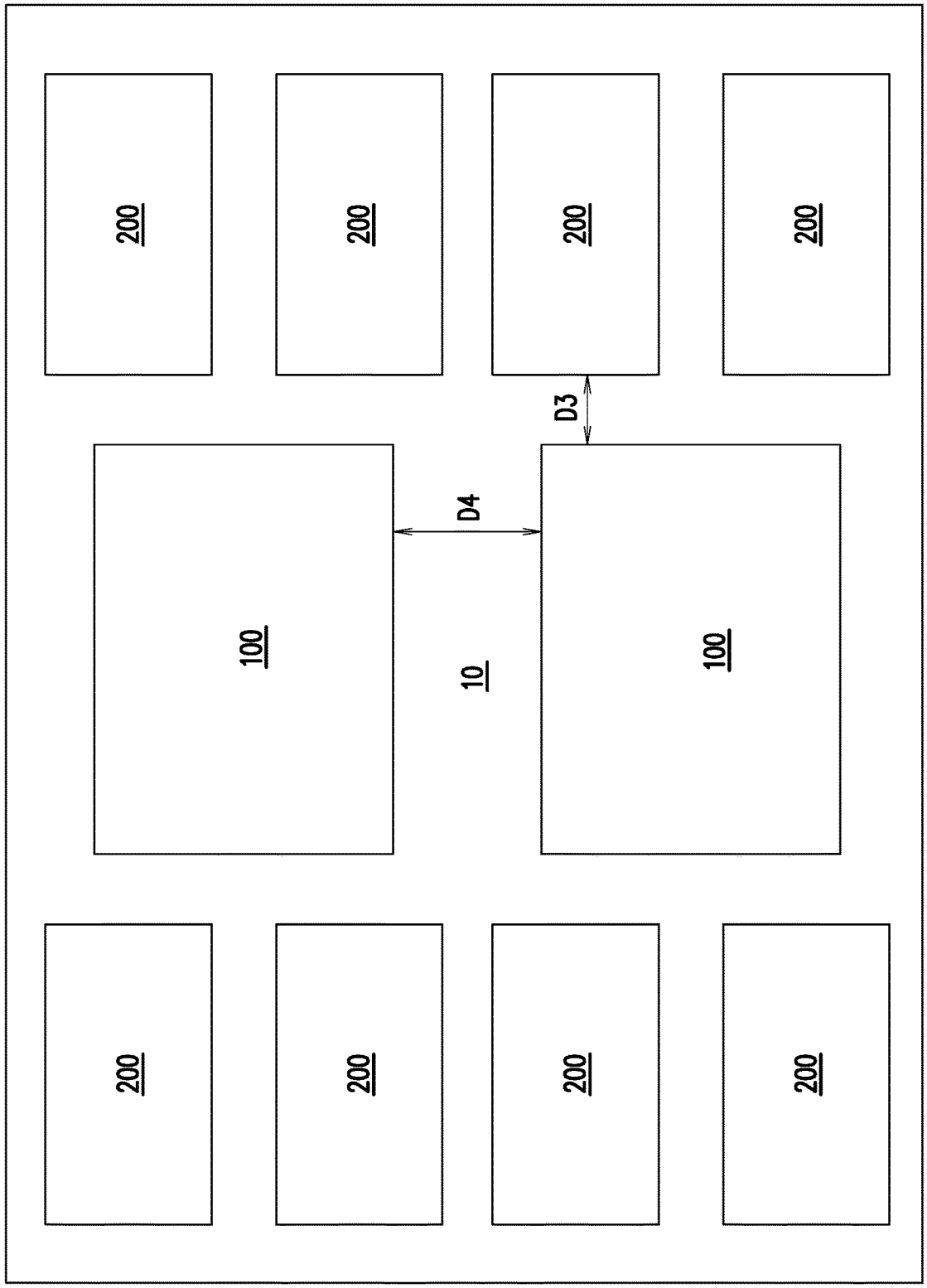
Figure 3C:
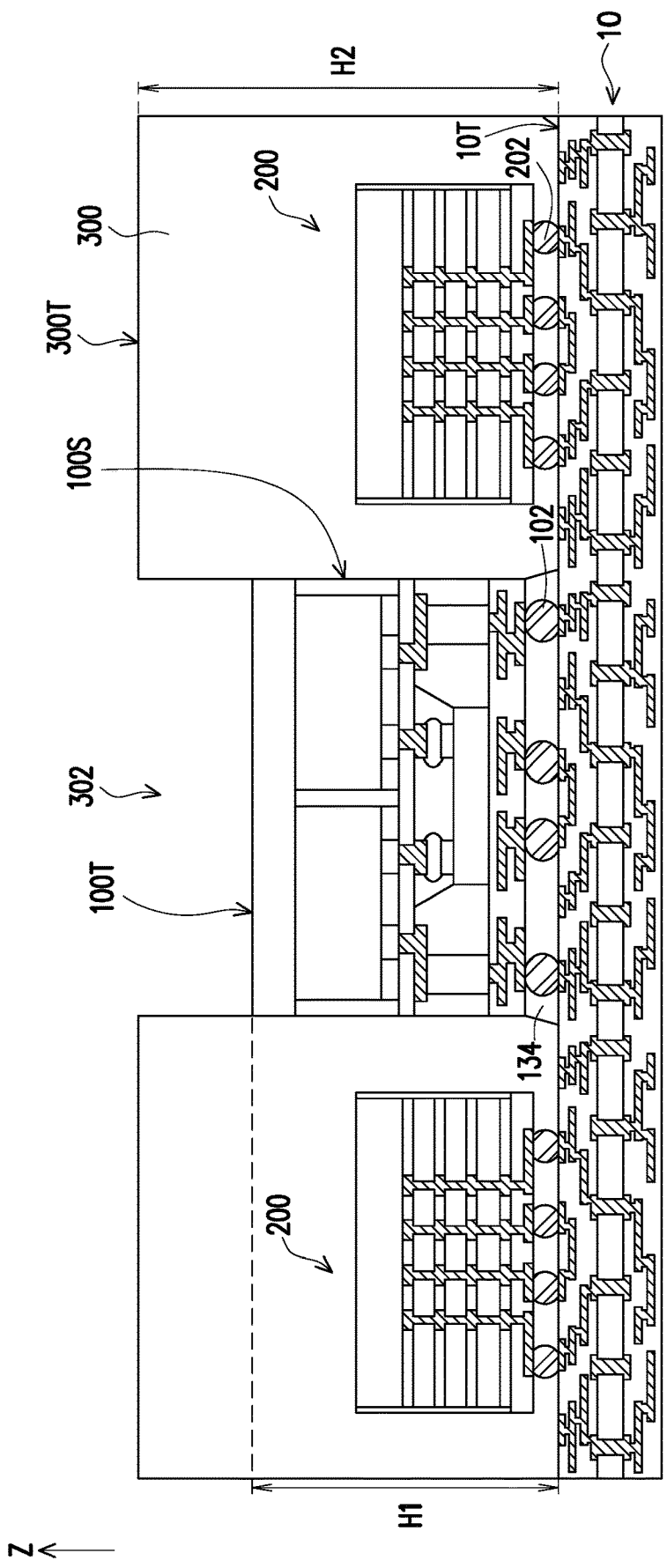
Figure 3D:
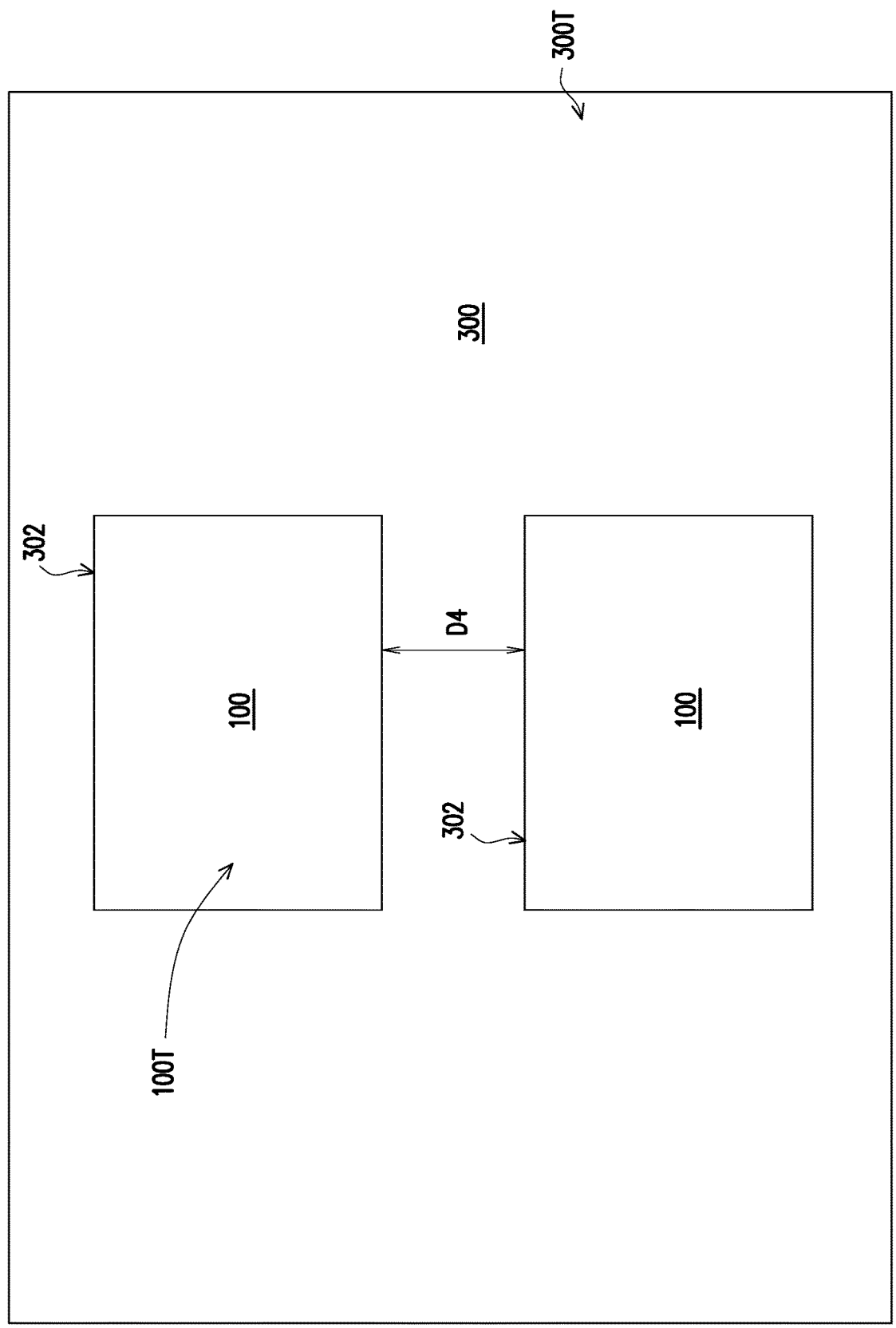

FIG. 3A through FIG. 3D are cross-sectional views and top views schematically illustrate various stages of a process for fabricating a package structure in accordance with some embodiments of the present disclosure. FIG. 3B is a schematic top view of the package structure illustrated in FIG. 3A. FIG. 3D is a schematic top view of the package structure illustrated in FIG. 3C. It is understood that the same or similar reference numbers may be used to label the same or similar elements as described in the previous embodiments, and the details will not be repeated for simplicity.

Referring to FIG. 3A and FIG. 3B, in some embodiments, first semiconductor elements 100 and second semiconductor elements 200 are mounted on and bonded to the substrate 10 respectively through first connectors 102 and second connectors 202 located there-between. In some embodiments, an underfill 134 is filled between the first semiconductor elements 100 and the substrate 10 surrounding the first connectors 102. Herein, the second semiconductor elements 200 are bonded to the substrate 10 without filling the underfill. In some embodiments, the first semiconductor elements 100 are of the same type or perform the same functions, and the second semiconductor elements 200 are of the same type or perform the same functions. In some embodiments, the first semiconductor elements 100 include logic dies, and the second semiconductor elements 200 include memory dies. The forming methods and the materials of the elements the same or similar to those illustrated in the previous embodiments will be omitted.

Referring to FIG. 3B, from the top view, two first semiconductor elements 100 and eight second semiconductor elements 200 mounted on the substrate 10 are arranged side by side, separate from one another with a proper distance. However, the scope of the disclosure is not limited thereto. In one embodiment, the first semiconductor elements 100 and the second semiconductor elements 200 are arranged as three columns, the two first semiconductor elements 100 are arranged in the middle column, two groups of four second semiconductor elements 200 are arranged as two left and right columns beside the middle column. In some embodiments, the four second semiconductor elements 200 in either column are aligned with one another and are spaced apart from the first semiconductor elements 100 with a distance D3, and the two first semiconductor elements 100 are spaced apart from each other with a distance D4. In some embodiments, the first semiconductor elements 100 and the second semiconductor elements 200 are arranged in a symmetrical way.

Referring to FIG. 3C and FIG. 3D, in some embodiments, a molding layer 300 is formed over the substrate 10 with openings 302, and the molding layer 300 covers the top surface 10T of the substrate 10 and the second semiconductor elements 200 but exposes the first semiconductor elements 100. In one embodiment, the two openings 302 are of substantially the same sizes and the locations of the two openings 302 correspond to the locations of the two first semiconductor elements 100. In some embodiments, the molding layer 300 encapsulates the second semiconductor elements 200 and at least covers the sidewalls 100S of the first semiconductor elements 100. In some embodiments, the molding layer 300 encapsulates the second semiconductor elements 200 and the second connectors 202, and the molding layer 300 wraps around the sidewalls 100S of the first semiconductor element 100 and the underfill 134. In some embodiments, the forming methods and the materials of the molding layer 300 are similar to those illustrated in the previous embodiments, and will not be described again.

As seen in FIG. 3C and FIG. 3D, the top surfaces 100T (the backside) of the two first semiconductor elements 100 are exposed from the openings 302, and the top surface 300T of the molding layer 300 is higher (in the thickness direction Z) than the top surface 100T of the first semiconductor element 100. In some embodiments, the height H2 of the molding layer 300 is larger than the height H1 of the first semiconductor element 100. In some embodiments, the height H2 is about 30%-100% larger than the height H1. That is, H2 is about 1.3 times to about 2.0 times of the height H1. In some embodiments, the height H2 is about 40%-80% larger than the height H1. That is, H2 is about 1.4 times to about 1.8 times of the height H1. In some embodiments, the height H2 is about 50%-60% larger than the height H1. That is, H2 is about 1.5 times to about 1.6 times of the height H1. Through forming thicker or higher molding layer 300, the molding layer 300 higher than the first semiconductor element 100 helps to relieve and counterbalance the potential warpage of the whole structure. In FIG. 3D, in one embodiment, the size (or span) of each opening 302 is substantially the same size (or span) of the corresponding first semiconductor element 100, and the entire top surface 100T of the corresponding first semiconductor element 100 is fully revealed by the opening 302. Similarly, the openings 302 may function as air gaps existing between the molding layer 300 and the first semiconductor elements 100, which promote the heat dissipation of the first semiconductor elements 100. It is understood that the number of the opening(s), the dimensions, sizes or shapes of the opening(s) are not limited by the embodiments provided herein.

Figure 4A:
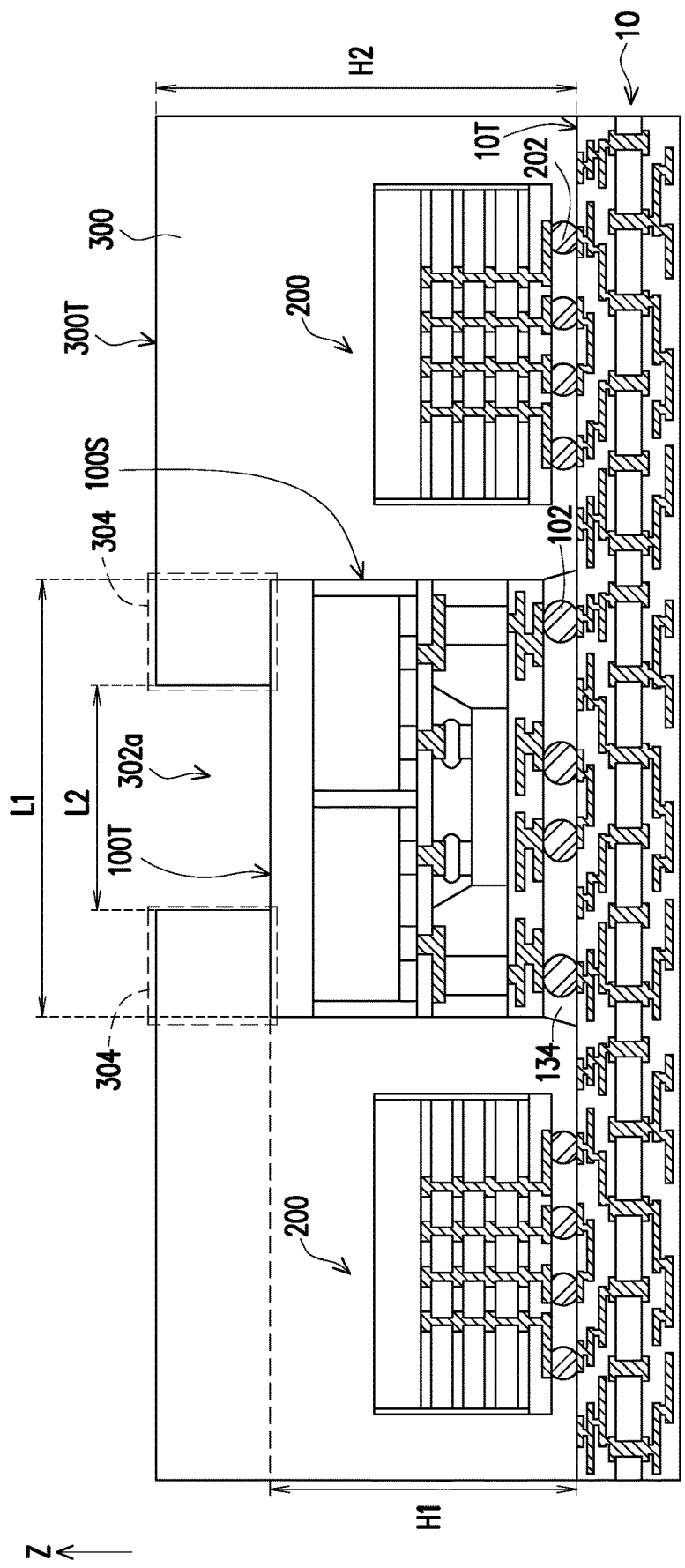
FIG. 4A illustrates a schematic cross-sectional view of a package structure in accordance with some embodiments of the present disclosure.
Figure 4B:
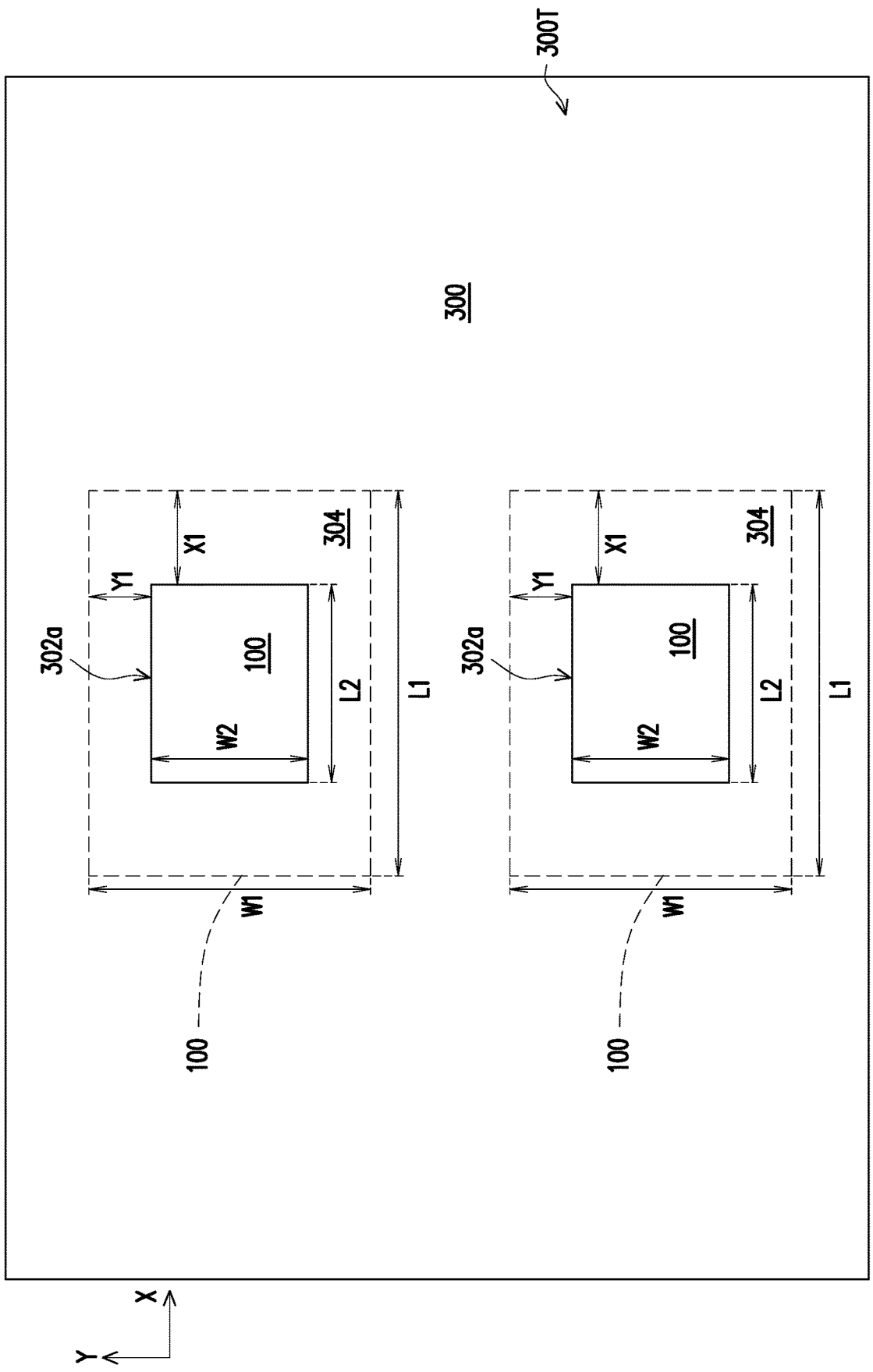
FIG. 4B is a schematic top view of the package structure illustrated in FIG. 4A.

FIG. 4A illustrates a cross sectional view of a package structure in accordance with some embodiments of the present disclosure. FIG. 4B is a top view of the package structure illustrated in FIG. 4A.

In some embodiments, the package structure illustrated in FIG. 4A and FIG. 4B has a structure similar to the structure illustrated in FIG. 3C and FIG. 3D, except that the molding layer 300 has two openings 302a partially revealed the top surfaces 100T of the two first semiconductor elements 100. As seen in FIG. 4A, the top surface 300T of the molding layer 300 is higher than the top surface 100T of the first semiconductor element 100, with the height H2 of the molding layer 300 larger than the height H1 of the first semiconductor element(s) 100. In some embodiments, the height H2 is about 30%-100% larger than the height H1. In some embodiments, the height H2 is about 40%-80% larger than the height H1. In some embodiments, the height H2 is about 50%-60% larger than the height H1. As seen in FIG. 4B, in one embodiment, the two openings 302a are of about the same sizes and the locations of the two openings 302a correspond to the locations of the two first semiconductor elements 100. In some embodiments, the size (or span) of either opening 302a is smaller than the size (or span) of the underlying first semiconductor element 100, and a central portion of the top surface 100T of the first semiconductor element 100 is revealed by the corresponding opening 302a.

In one embodiment, the first semiconductor element 100 (the span of the first semiconductor element 100 is shown as a dashed line rectangle) has a length L1 and a width W1, and the smaller opening 302a has a length L2 and a width W2. In some embodiments, the length L2 is about 5-50% of the length L1, while the width W2 is about 5-50% of the width W1. In some embodiments, the length L2 is about 10-40% of the length L1, while the width W2 is about 10-40% of the width W1. In some embodiments, the length L2 is about 20-30% of the length L1, while the width W2 is about 20-30% of the width W1. In some embodiments, the area of the vertical projection of the opening 302a is smaller than the whole area of the top surface 100T of the first semiconductor element 100. In some embodiments, the vertical projection of the opening 302a occupies about 25% to about 0.25% of the whole area of the top surface 100T of the first semiconductor element 100. That is, about 25% to about 0.25% of the whole area of the top surface 100T of one first semiconductor element 100 is exposed from one openings 302a. In some embodiments, about 16% to about 1% of the whole area of the top surface 100T of the first semiconductor element 100 is revealed by the opening 302a. In some embodiments, about 9% to about 4% of the whole area of the top surface 100T of the first semiconductor element 100 is revealed by the opening 302a.

Referring to FIG. 4A and FIG. 4B, in one embodiment, the molding layer 300 has extended portions 304 located directly on the top surface of the first semiconductor element 100, and the extended portions 304, from the sidewalls 100S, extend inwardly along the top surface 100T with an extension length X1 in the X-direction and an extension length Y1 in the Y-direction. In other words, the smaller opening 302a is defined by the extended portions 304. In some embodiments, the extension length X1 is about 25-47.5% of the length L1, and the extension length Y1 is about 25-47.5% of the width W1. In some embodiments, the extension length X1 in the X-direction is about 30-45% of the length L1, and the extension length Y1 in the Y-direction is about 30-45% of the width W1. In some embodiments, the extension length X1 in the X-direction is about 35-40% of the length L1, and the extension length Y1 in the Y-direction is about 35-40% of the width W1. Through forming the molding layer 300 with the extended portions 304, the extended portions 304 in direct contact with the top surface 100T of the first semiconductor element 100 further lessen and counterbalance the potential warpage of the whole structure.

Figure 4C:
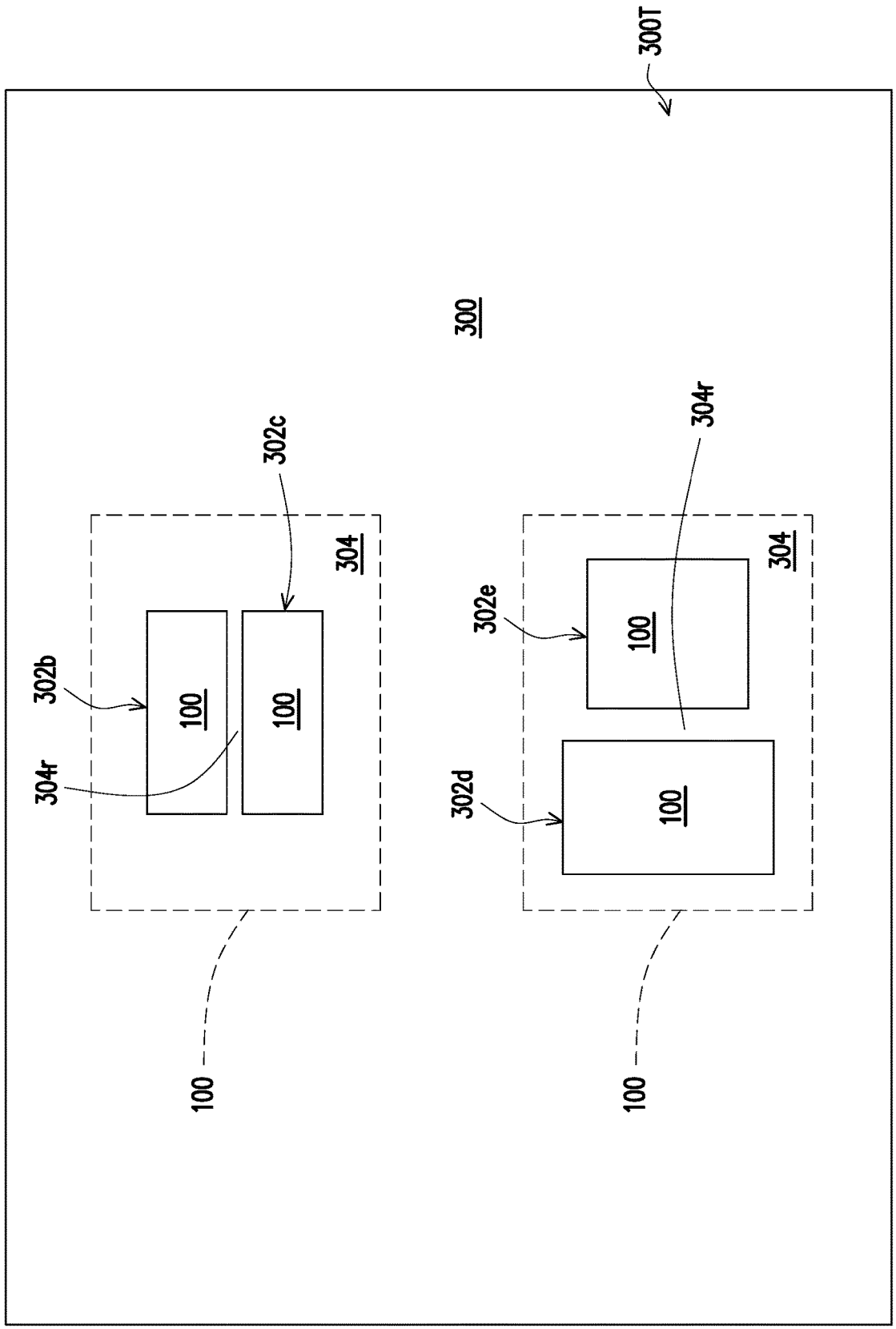
FIG. 4C is a top view of a package structure in accordance with some embodiments of the present disclosure.

FIG. 4C is a schematic top view of a package structure in accordance with some embodiments of the present disclosure.

Referring to FIG. 4C, in one alternative embodiment, the molding layer 300 has openings 302b, 302c, 302d and 302e, and the top surface 100T of either first semiconductor element 100 is partially revealed by two separate openings. As seen in FIG. 4C, the two openings 302b and 302c are arranged above the upper first semiconductor element 100, while the two openings 302d and 302e are arranged above the lower first semiconductor element 100. In some embodiments, the two openings 302b, 302c are separate from each other, the two openings 302d, 302e are separate from each other, and the molding layer 300 has a rib portion 304r extending in the X-direction between the two openings 302b and 302c and another rib portion 304r extending in the Y-direction between the two openings 302d and 302e. In some embodiments, for the upper first semiconductor element 100, the vertical projections of the two openings 302b and 302c totally occupy about 90% to about 5% of the whole area of the top surface 100T of the first semiconductor element 100, and the extended portions 304 and the rib portion 304r occupy about 10% to about 95% of the whole area of the top surface 100T of the first semiconductor element 100. In some embodiments, for the upper first semiconductor element 100, the vertical projections of the two openings 302b and 302c totally occupy about 65% to about 45% of the whole area of the top surface 100T of the first semiconductor element 100, and the extended portions 304 and the rib portion 304r occupy about 35% to about 55% of the whole area of the top surface 100T of the first semiconductor element 100. In some embodiments, the vertical projections of the two openings 302d and 302e totally occupy about 90% to about 5% of the whole area of the top surface 100T of the first semiconductor element 100, and the extended portions 304 and the rib portion 304r occupy about 10% to about 95% of the whole area of the top surface 100T of the first semiconductor element 100. In some embodiments, the vertical projections of the two openings 302d and 302e totally occupy about 75% to about 55% of the whole area of the top surface 100T of the first semiconductor element 100, and the extended portions 304 and the rib portion 304r occupy about 25% to about 45% of the whole area of the top surface 100T of the first semiconductor element 100. Although the openings 302b, 302c, 302d, 302e are shown as rectangular openings in FIG. 4C, the arrangements, the number and the shapes of the openings may be adjusted or modified as long as the extended portions and/or the rib portion(s) occupy certain area percentage of the top surface of either first semiconductor element 100. In one embodiment, some of the openings 302b, 302c, 302d, 302e have different shapes.

Figure 5:
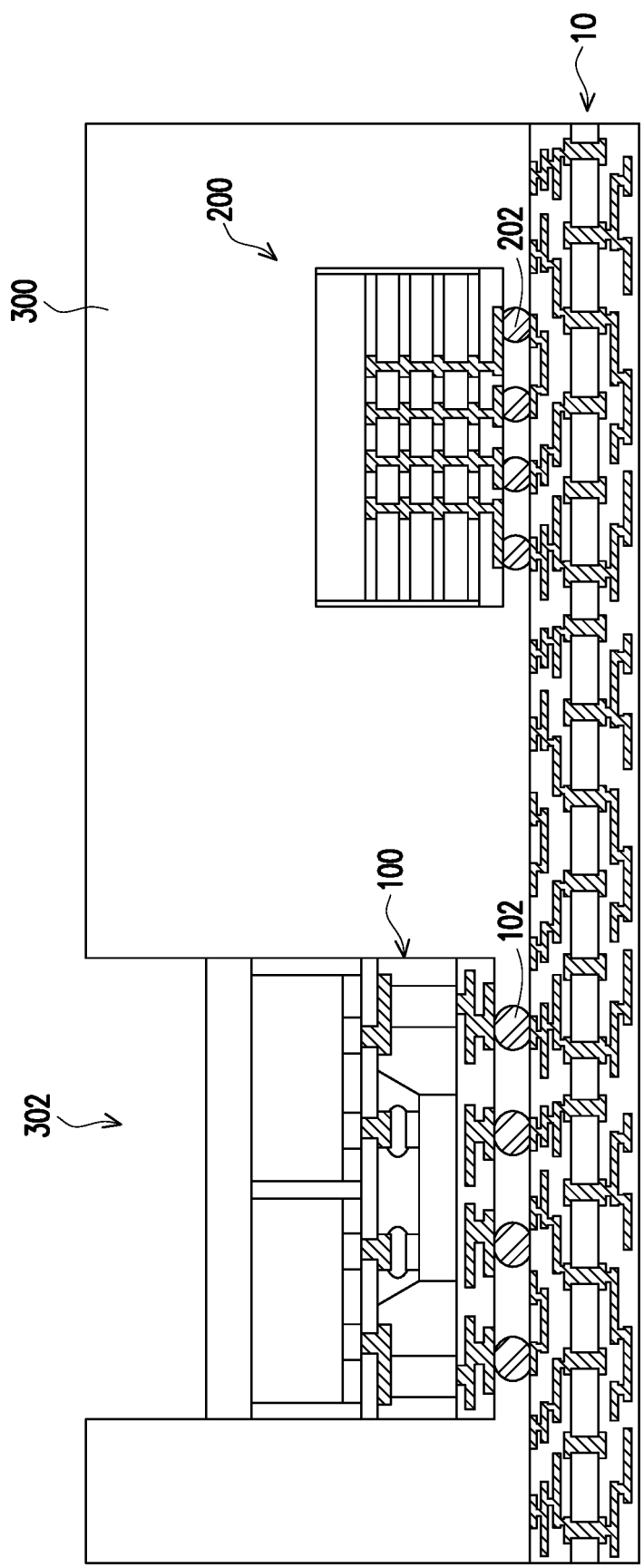
FIG. 5 illustrates a schematic cross-sectional view of a package structure in accordance with some embodiments of the present disclosure.
Figure 6:
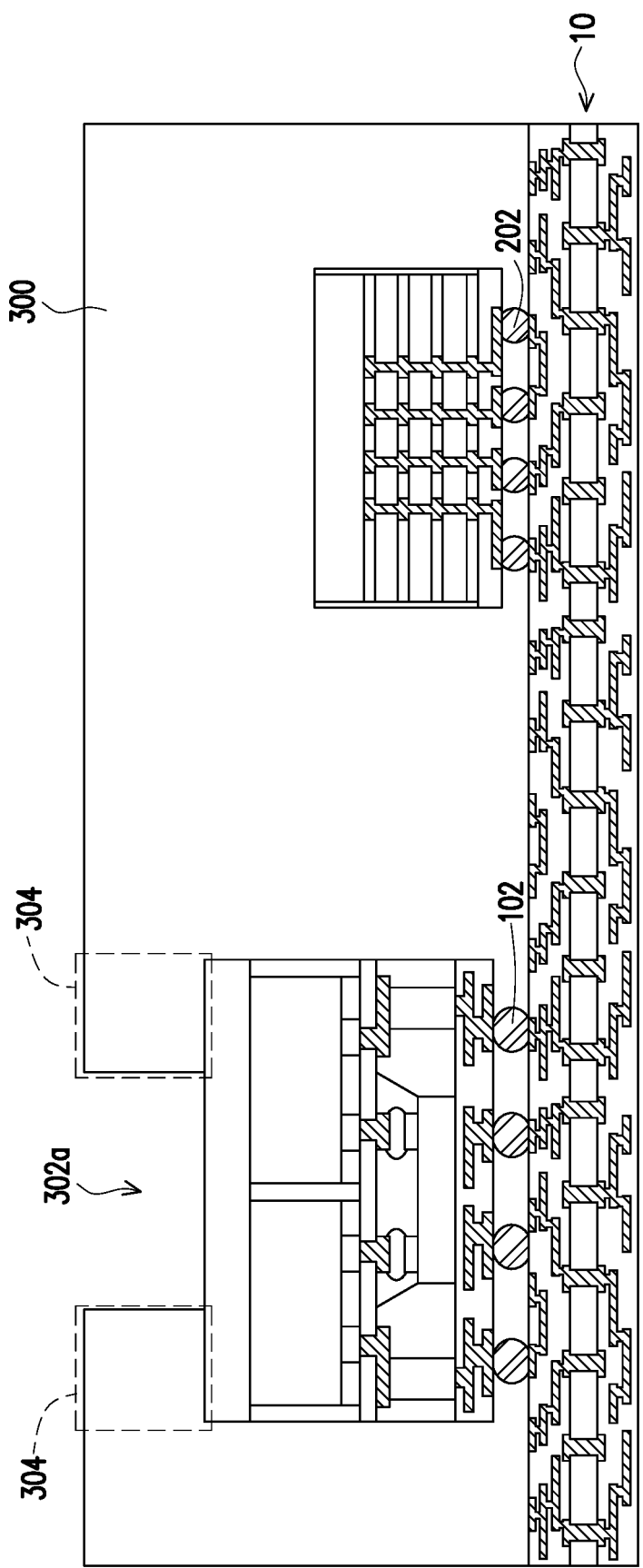
FIG. 6 illustrates a schematic cross-sectional view of a package structure in accordance with some embodiments of the present disclosure.

FIG. 5 and FIG. 6 are schematic cross-sectional views of package structures in accordance with some embodiments of the present disclosure. For purpose of clarity and simplicity, detail description of same or similar features may be omitted, and the same or similar reference numbers denote the same or like components. The package structure shown in FIG. 5 is similar to the structure shown in FIG. 1F and may be fabricated following the similar process steps described in the previous embodiments, but no underfill is formed between the first semiconductor element 100 and the substrate 10 to secure the first semiconductor element 100 so that the molding layer 300 is in direct contact with the connectors 102. The package structure shown in FIG. 6 is similar to the structure shown in FIG. 2A and may be fabricated following the similar process steps described in the previous embodiments, but no underfill is formed between the first semiconductor element 100 and the substrate 10 to secure the first semiconductor element 100 so that the molding layer 300 is in direct contact with the connectors 102.

Figure 7:
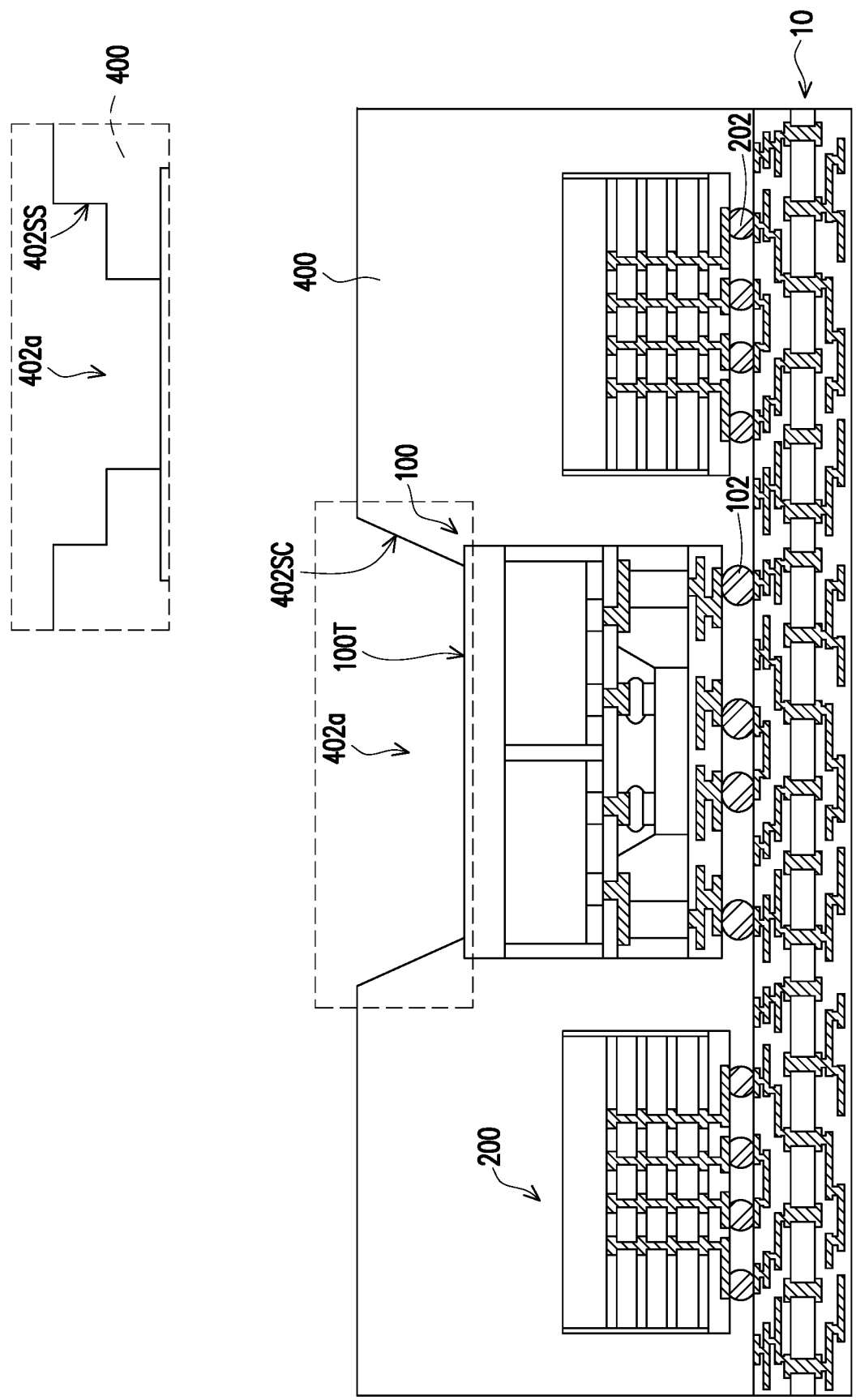
FIG. 7 illustrates schematic cross-sectional views of various package structures in accordance with some embodiments of the present disclosure.

FIG. 7 illustrates schematic cross-sectional views of various package structures in accordance with some embodiments of the present disclosure. The package structure shown in FIG. 7 is similar to the structure shown in FIG. 4A, except that a molding layer 400 having at least one opening 402a is formed over the substrate 10. In some embodiments, the molding layer 400 is formed by a transfer molding process, and the opening 402a may be formed in various shapes though the design of the mold. In some embodiments, the opening 402a exposes a portion of the top surface 100T of the first semiconductor element 100, the opening 402a has slant sidewalls 402SC, and the opening 402a may have a shape of inverted conical frustum from the top view. In some embodiments, the span of the top of the opening 402a is equivalent to or slightly larger than the span of the underlying first semiconductor element 100, while the span of the bottom of the opening 402a is smaller than the span of the underlying first semiconductor element 100. In some other embodiments, the span of the top of the opening 402a may be larger than the span of the underlying first semiconductor element 100, while the span of the bottom of the opening 402a is equivalent to the span of the underlying first semiconductor element 100. In some embodiments, as seen from the partial cross-sectional view shown at the top right part of FIG. 7, the opening 402a has sidewalls 402SS with staircase side profiles. In some embodiments, for the opening 402a with sidewalls 402SS, the span of the top of the opening 402a may be larger than the span of the underlying first semiconductor element 100, while the span of the middle or the bottom of the opening 402a is smaller than the span of the underlying first semiconductor element 100. In some other embodiments, the span of the top of the opening 402a may be larger than the span of the underlying first semiconductor element 100, while the span of the bottom of the opening 402a is equivalent to the span of the underlying first semiconductor element 100.

Figure 8:
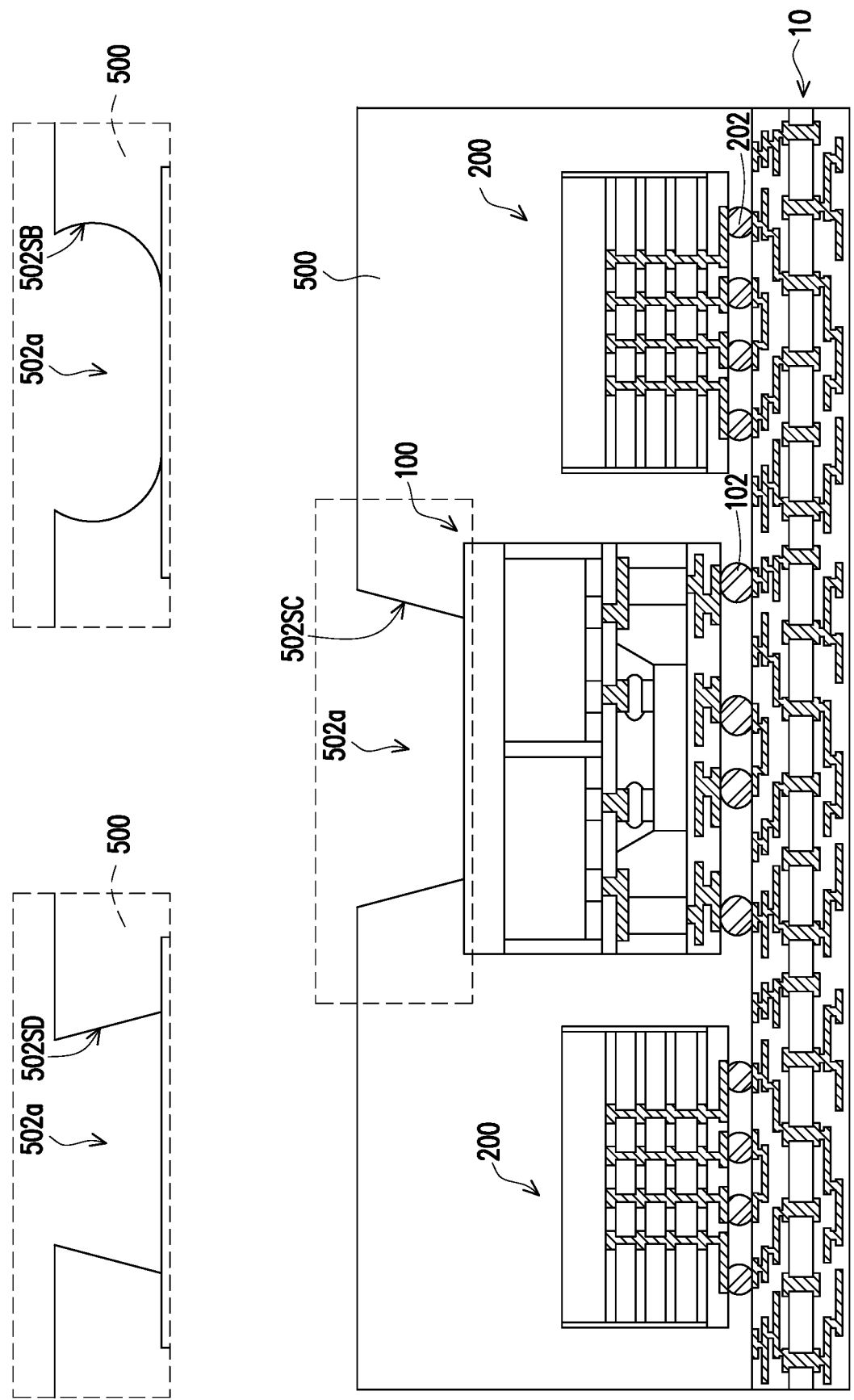
FIG. 8 illustrates schematic cross-sectional views of various package structures in accordance with some embodiments of the present disclosure.

FIG. 8 illustrates schematic cross-sectional views of various package structures in accordance with some embodiments of the present disclosure. The package structure shown in FIG. 8 is similar to the structure shown in FIG. 4A, except that a molding layer 500 having at least one opening 502a is formed over the substrate 10. In some embodiments, the opening 502a exposes a portion of the top surface 100T of the first semiconductor element 100 and the opening 502a has slant sidewalls 502SC, and the opening 502a may have a shape of inverted conical frustum from the top view. In some embodiments, the span of the top or the bottom of the opening 502a is smaller than the span of the underlying first semiconductor element 100.

In some embodiments, the opening 502a may be formed in the molding layer 500 through an etching process, and depending on the etching process used, the opening 502a may be formed with various sidewall profiles. In some embodiments, as seen from the partial cross-sectional view shown at the top left part of FIG. 8, the opening 502a has sloped sidewalls 502SD, and the opening 502a may have a shape of conical frustum from the top view. In some embodiments, as seen from the partial cross-sectional view shown at the top right part of FIG. 8, the opening 502a has curved bowl-shaped sidewalls 502SB.

Figure 9:
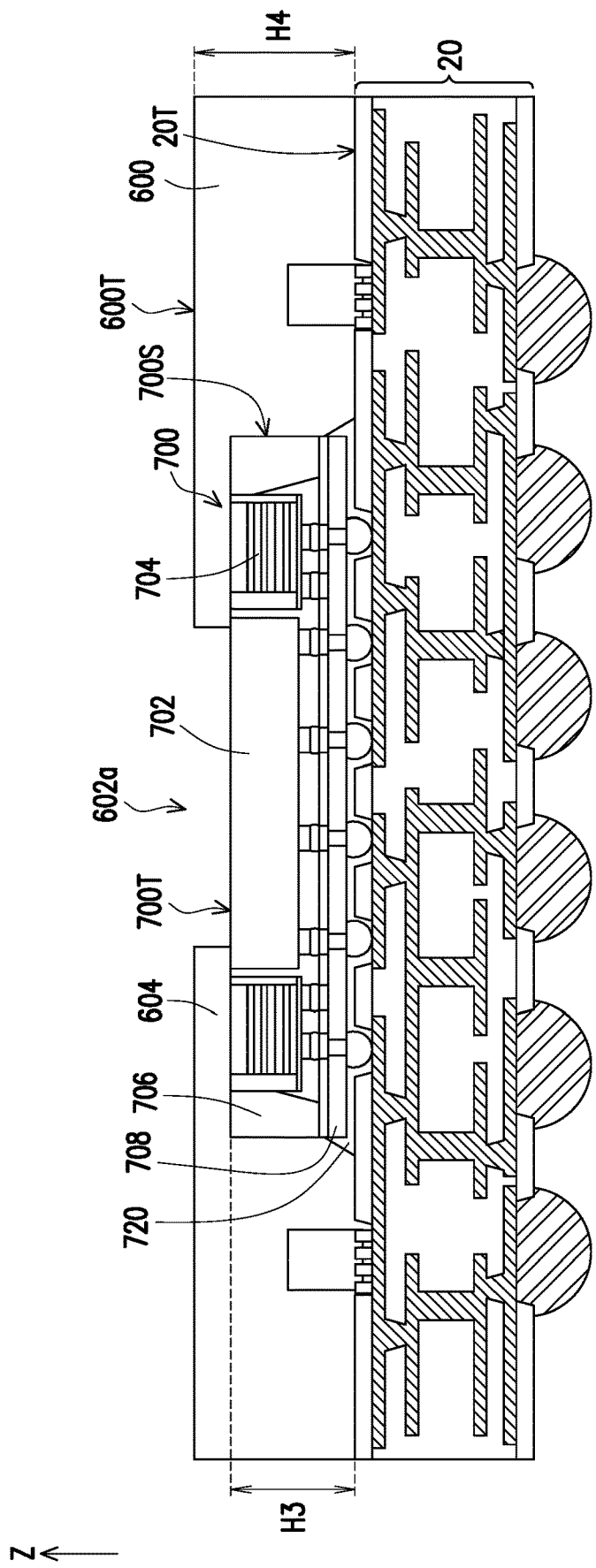
FIG. 9 illustrates a cross-sectional view of a package structure in accordance with some embodiments of the present disclosure.

FIG. 9 illustrates a cross sectional view of a package structure in accordance with some embodiments of the present disclosure.

In some embodiments, a package 700 and passive components 90 are bonded to and electrically connected to a substrate 20, and a molding layer 600 having at least one opening 602a is formed over the substrate 20 and covers the package 700 and the passive components 90. In some embodiments, the molding layer 600 covers the top surface 20T of the substrate 20 and the passive components 90 but exposes a top surface 700T of the package 700. In some embodiments, the molding layer 600 at least covers a portion of the top surface 700T and covers the sidewalls 700S of the package 700. In some embodiments, an underfill 720 is filled between the package 700 and the substrate 20 to secure the bonding between the package 700 and the substrate 20 and further improves the structural integrity of the structure. In some embodiments, the molding layer 600 wraps around the package 700 and the underfill 720. In one embodiment, the package 700 includes or is a chip-on-wafer-on-substrate (CoWoS) package, and the package 700 includes a first die 702 and second dies 704 laterally wrapped by an encapsulant 706 and an interposer 708 for electrically connecting the first and second dies with the underlying substrate 20. In one embodiment, the first die 702 includes a system-on-integrated-circuit (SoIC) die, and the second dies 704 include memory dies.

As seen in FIG. 9, the top surface 700T (the backside) of the package 700 is exposed from the opening 602a, and the top surface 600T of the molding layer 600 is higher (in the thickness direction Z) than the top surface 700T of the package 700. In some embodiments, the height H4 of the molding layer 600 is larger than the height H3 of the package 700. In some embodiments, the height H4 is about 30%-100% larger than the height H3. In some embodiments, the height H4 is about 40%-80% larger than the height H3. In some embodiments, the height H4 is about 50%-60% larger than the height H3. In one embodiment, the size (or span) of the opening 602a is smaller than the size (or span) of the package 700, and a central portion of the top surface 700T of the package 700 is revealed by the opening 602a. That is, the top surface 700T of the package 700 is exposed and bare. In one embodiment, a portion of the backside of the first die 702 is exposed by the opening 602a and the span of the opening 602a may be smaller than the span of the first die 702. In some embodiment, about 25% to about 0.25% of the whole area of the top surface 700T of the package 700 is revealed by the opening 602a. In some embodiments, about 16% to about 1% of the whole area of the top surface 700T of the package 700 is revealed by the opening 602a. In some embodiments, about 9% to about 4% of the whole area of the top surface 700T of the package 700 is revealed by the opening 602a. In one embodiment, as the top surface 700T of the package 700 (e.g. the top surface of the first die 702) is exposed and bare, the opening 602a functions as an air gap, which promotes the heat dissipation of the package 700 (especially the first die 702).

Referring to FIG. 9, in one embodiment, the molding layer 600 has extended portions 604 located directly on the top surface 700T of the package 700, and the extended portions 604 extend from the sidewalls 700S inwardly into the span of the first die 702. Through forming the molding layer 600 with the extended portions 604, the extended portions 604 in direct contact with the top surface 700T of the package 700 lessen and counterbalance the potential warpage of the whole structure.

In some embodiments, due to the molding layer having the thickness higher than some of the elements or packages, the package structures with less warpage and compact in sizes are obtained through straightforward fabricating processes. In some embodiments, the warpage of the package structure may be decreased by 15% to 35% compared to the package structures with levelled molding layer. Furthermore, thermal dissipation of the package structure is also improved as air gaps present above the revealed portions of the elements in the package structure.

In accordance with some embodiments of the disclosure, a package structure including a substrate, a first semiconductor element disposed on and electrically connected with the substrate, a second semiconductor element disposed on and electrically connected with the substrate and a molding layer disposed over the substrate and covering at least a top surface of the substrate is provided. The second semiconductor element and the first semiconductor element perform different functions. The molding layer encapsulates the second semiconductor element and wraps around sidewalls of the first semiconductor element. A top surface of the molding layer is higher than a top surface of the first semiconductor element. The molding layer has an opening extending from the top surface of the molding layer to the top surface of the first semiconductor element, so that the top surface of the first semiconductor element is exposed.

In accordance with some embodiments of the disclosure, a package structure including a substrate, a first semiconductor element disposed on the substrate and electrically connected with the substrate, second semiconductor elements disposed on the substrate and electrically connected with the substrate and a molding layer disposed on the substrate is provided. The first semiconductor element includes a first semiconductor die. At least one of the second semiconductor elements includes a second semiconductor die. The first and second semiconductor dies perform different functions. The molding layer covers the first semiconductor element and encapsulates the second semiconductor elements. A top surface of the molding layer is higher than a top surface of the first semiconductor element. The molding layer has an opening extending from the top surface of the molding layer to the top surface of the first semiconductor element to expose the top surface of the first semiconductor element.

In accordance with some embodiments of the disclosure, a method for forming a package structure is provided. The method for forming a package structure includes providing a substrate; mounting and bonding a first semiconductor element onto the substrate; mounting and bonding a second semiconductor element onto the substrate; forming a molding material layer over the substrate covering the first and second semiconductor elements; and forming a molding layer with an opening to expose a top surface of the first semiconductor element. A top surface of the molding layer is higher than a top surface of the first semiconductor element. The opening extends from the top surface of the molding layer to the top surface of the first semiconductor element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a substrate, wherein the substrate is a circuit substrate having a core layer and plated through holes passing through the core layer;
a first semiconductor element, disposed on the substrate;
a second semiconductor element, disposed on the substrate, wherein the second semiconductor element and the first semiconductor element perform different functions; and
a molding layer, disposed over the substrate and covering at least a top surface of the substrate,
wherein the molding layer encapsulates the second semiconductor element and wraps around sidewalls of the first semiconductor element, a top surface of the molding layer is higher than a top surface of the first semiconductor element, and the molding layer has a first opening and a second opening extending from the top surface of the molding layer to the top surface of the first semiconductor element and a rib portion located on the top surface of the first semiconductor element and between the first and second openings, the top surface of the first semiconductor element is a non-active surface and exposed by the first and second openings.

2. The structure according to claim 1, wherein the molding layer has a first thickness measuring from the top surface of the substrate to the top surface of the molding layer, the first semiconductor element has a second thickness measuring from the top surface of the substrate to the top surface of the first semiconductor element, and the first thickness is about 30% to about 100% larger than the second thickness.

3. The structure according to claim 1, wherein the first semiconductor element includes an insulative cover, and the insulative cover at the top surface of the first semiconductor element is partially revealed by the first and second openings of the molding layer.

4. The structure according to claim 3, wherein the molding layer has extended portions located directly on the top surface of the first semiconductor element, and the first and second openings are defined by the extended portions and the rib portion.

5. The structure according to claim 3, wherein about 0.25% to about 25% of a whole area of the top surface of the first semiconductor element is revealed by the first and second openings of the molding layer.

6. The structure according to claim 1, further comprising first connectors disposed between the substrate and the first semiconductor element and an underfill filled between the first connectors, the first semiconductor element and the substrate.

7. The structure according to claim 1, further comprising second connectors disposed between the substrate and the second semiconductor element and an underfill filled between the second connectors, the second semiconductor element and the substrate.

8. The structure according to claim 1, wherein the first semiconductor element comprises:
a redistribution circuit structure;
a first integrated circuit disposed on the redistribution circuit structure;
a first insulating encapsulant, disposed on the redistribution circuit structure and encapsulating the first integrated circuit;
a plurality of conductive pillars, disposed on the redistribution circuit structure and penetrating through the first insulating encapsulant;
a plurality of second integrated circuits, disposed over the first insulating encapsulant and electrically connected with the first integrated circuit; and
a second insulating encapsulant, disposed over the first insulating encapsulant and encapsulating the plurality of second integrated circuits.

9. A package structure, comprising:
a substrate, wherein the substrate is a circuit substrate having a core layer and plated through holes passing through the core layer;
a first semiconductor element, disposed on a top surface of the substrate and electrically connected with the substrate, wherein the first semiconductor element includes a first semiconductor die;
second semiconductor elements, disposed on the top surface of the substrate, side-by-side with the first semiconductor element and spaced apart from the first semiconductor element, and electrically connected with the substrate, wherein at least one of the second semiconductor elements includes a second semiconductor die, and the first and second semiconductor dies perform different functions; and
a molding layer, disposed on the substrate, covering the first semiconductor element and encapsulating the second semiconductor elements,
wherein a top surface of the molding layer is higher than top surfaces of the first semiconductor element and the second semiconductor elements, and the molding layer has an opening extending from the top surface of the molding layer to the top surface of the first semiconductor element to expose the top surface of the first semiconductor element.

10. The package structure according to claim 9, wherein the opening of the molding layer has slant sidewalls, and the top surface of the first semiconductor element is fully revealed by the opening of the molding layer.

11. The package structure according to claim 9, wherein the opening of the molding layer has slant sidewalls, and the top surface of the first semiconductor element is partially revealed by the opening of the molding layer.

12. The package structure according to claim 11, wherein a top span of the opening is larger than a span of the first semiconductor element, and a bottom span of the opening is smaller the span of the first semiconductor element.

13. The package structure according to claim 11, wherein a top span of the opening is smaller than a span of the first semiconductor element, and a bottom span of the opening is smaller the span of the first semiconductor element.

14. The package structure according to claim 9, wherein the opening of the molding layer has curved sidewalls, and the top surface of the first semiconductor element is partially revealed by the opening of the molding layer.

15. The package structure according to claim 9, wherein the molding layer has extended portions located directly on the top surface of the first semiconductor element to define the opening of the molding layer, and the opening exposes a top surface of the first die of the first semiconductor element.

16. The package structure according to claim 9, further comprising first connectors disposed between the substrate and the first semiconductor element and an underfill filled between the first connectors, the first semiconductor element and the substrate.

17. The package structure according to claim 9, further comprising second connectors disposed between the substrate and the second semiconductor elements and underfills filled between the second connectors, the second semiconductor elements and the substrate.

18. The package structure according to claim 9, wherein the first semiconductor element comprises:
 a redistribution circuit structure;
 a first integrated circuit disposed on the redistribution circuit structure;
 a first insulating encapsulant, disposed on the redistribution circuit structure and encapsulating the first integrated circuit;
 a plurality of conductive pillars, disposed on the redistribution circuit structure and penetrating through the first insulating encapsulant;
 a plurality of second integrated circuits, disposed over the first insulating encapsulant and electrically connected with the first integrated circuit; and
 a second insulating encapsulant, disposed over the first insulating encapsulant and encapsulating the plurality of second integrated circuits.

19. A method for forming a package structure, comprising:
 providing a substrate, wherein the substrate is a circuit substrate having a core layer and plated through holes passing through the core layer;
 mounting and bonding a first semiconductor element onto the substrate;
 mounting and bonding a second semiconductor element onto the substrate;
 forming a layer of a molding material over the substrate covering the first and second semiconductor elements; and
 removing a portion of the layer of the molding material to form a molding layer with a first opening and a second opening to expose a top surface of the first semiconductor element and a rib portion located on the top surface of the first semiconductor element and between the first and second openings, wherein a top surface of the molding layer is higher than the top surface of the first semiconductor element, the first and second openings extend from the top surface of the molding layer to the top surface of the first semiconductor element, the top surface of the first semiconductor element is a non-active surface and the first and second openings expose the non-active surface of the first semiconductor element.

20. The method according to claim 19, wherein removing a portion of the layer of the molding material includes performing an etching process until an insulative cover of the first semiconductor element is exposed.

\* \* \* \* \*